United States Patent
Oda et al.

(10) Patent No.: US 12,113,403 B2
(45) Date of Patent: Oct. 8, 2024

(54) DRIVE DEVICE

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventors: Kota Oda, Yokkaichi (JP); Masayuki Kato, Yokkaichi (JP); Ryohei Sawada, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 411 days.

(21) Appl. No.: 17/753,159

(22) PCT Filed: Aug. 13, 2020

(86) PCT No.: PCT/JP2020/030754
§ 371 (c)(1),
(2) Date: Feb. 22, 2022

(87) PCT Pub. No.: WO2021/039415
PCT Pub. Date: Mar. 4, 2021

(65) Prior Publication Data
US 2022/0345010 A1    Oct. 27, 2022

(30) Foreign Application Priority Data
Aug. 30, 2019   (JP) ................................ 2019-158596

(51) Int. Cl.
*H02K 11/33* (2016.01)
*H02K 11/26* (2016.01)
(Continued)

(52) U.S. Cl.
CPC ............. *H02K 11/33* (2016.01); *H02K 11/26* (2016.01); *H02K 11/27* (2016.01); *H02M 7/48* (2013.01);
(Continued)

(58) Field of Classification Search
CPC .... H02K 2213/06; H02K 11/27; H02K 11/26; H02K 11/33; H03K 17/063; H02M 7/48
(Continued)

(56) References Cited

U.S. PATENT DOCUMENTS

2003/0030394 A1    2/2003  Majumdar et al.
2015/0326000 A1*  11/2015  Kanzaki ................. H02H 1/003
                                                        361/101
2018/0337624 A1*  11/2018  Moritake .............. H02P 29/027

FOREIGN PATENT DOCUMENTS

JP    2009-213234 A    9/2009

OTHER PUBLICATIONS

Kamiyama et al. (JP 07177756 A), Inverter Circuit for Three=phase Motor of E.g. Air-conditioner Has Transistor Drive Circuit With Latch Circuit That Interrupts PWM Input Signal When Lower or Upper Arm Detects Overcurrent and Resumes Transistor Operation After Fixed Time Period Date Pub: Jul. 14, 1995 (Year: 1995).*

(Continued)

*Primary Examiner* — Jorge L Carrasquillo
(74) *Attorney, Agent, or Firm* — Honigman LLP

(57) ABSTRACT

A drive device drives a motor serving as a load. A first upstream switch is disposed upstream from the motor and a first downstream switch is disposed downstream from the motor in a first current path of current flowing via the motor. A second upstream switch is disposed upstream from the motor and a second downstream switch is disposed downstream from the motor in a second current path of current flowing via the motor. A direction of the current flowing in (Continued)

the motor when current flows in the first current path is different from a direction of the current flowing in the motor when current flows in the second current path. The first upstream drive circuit stops flow of current via the first upstream switch when the current flowing through the first upstream switch becomes greater than or equal to a current threshold.

11 Claims, 20 Drawing Sheets

(51) Int. Cl.
*H02K 11/27* (2016.01)
*H02M 7/48* (2007.01)
*H03K 17/06* (2006.01)

(52) U.S. Cl.
CPC ....... *H03K 17/063* (2013.01); *H02K 2213/06* (2013.01)

(58) Field of Classification Search
USPC ....................................................... 318/798
See application file for complete search history.

(56) References Cited

OTHER PUBLICATIONS

Fukunaga et al. (EP 664595 A2) Controller for Power Devices Employing High Breakdown Voltage Semiconductor Elements Comprises External Controller Connected to Internal Control Circuit Connected to Level Shift Circuit and Gate Electrode of Transistor, With Power Supply Voltage Applied to Control Circui (Year: 1995).*

International Search Report, Application No. PCT/JP2020/030754, mailed Oct. 20, 2020. ISA/Japan Patent Office.

* cited by examiner

DRIVE DEVICE

CROSS-REFERENCE TO RELATED APPLICATIONS

This application is the U.S. national stage of PCT/JP2020/030754 filed on Aug. 13, 2020, which claims priority of Japanese Patent Application No. JP 2019-158596 filed on Aug. 30, 2019, the contents of which are incorporated herein.

TECHNICAL FIELD

The present disclosure relates to a drive device.

BACKGROUND

Japanese Unexamined Patent Application Publication No. 2009-213234 discloses a drive device for a vehicle, which drives a motor that rotates in forward and reverse directions. In this drive device, in a first current path of current flowing from a DC power supply via a motor, a first upstream switch is disposed upstream from the motor, and a first downstream switch is disposed downstream from the motor. Furthermore, in a second current path of current flowing from the DC power supply via the motor, a second upstream switch is disposed upstream from the motor, and a second downstream switch is disposed downstream from the motor. The direction of the current flowing through the motor when the current is flowing through the first current path is different from the direction of the current flowing through the motor when the current is flowing through the second current path.

The first upstream switch and the first downstream switch are switched on, and the second upstream switch and the second downstream switch are switched off. This causes current to flow through the first current path, and the motor rotates in the forward direction. The first upstream switch and the first downstream switch are switched off, and the second upstream switch and the second downstream switch are switched on. This causes current to flow through the second current path, and the motor rotates in the reverse direction.

In a conventional drive device such as that disclosed in Japanese Unexamined Patent Application Publication No. 2009-213234, when the first upstream switch and the second downstream switch are on, the DC power supply will short-circuit and a large current will flow. A large current continuing to flow for a long period of time can cause a variety of problems.

One conceivable configuration of switching a first upstream switch, a first downstream switch, a second upstream switch, and a second downstream switch arranged as described in Japanese Unexamined Patent Application Publication No. 2009-213234 on or off is a configuration in which four drive circuits switch the first upstream switch, the first downstream switch, the second upstream switch, and the second downstream switch on or off, respectively. In this configuration, a microcomputer instructs each drive circuit to switch on or off. In this case, the microcomputer is performing a variety of types of processing, and thus the timing at which the microcomputer instructs each drive circuit to turn on or off may be delayed from the appropriate timing.

In this case, the timing of switching on or off will be delayed from the appropriate timing for each of the first upstream switch, the first downstream switch, the second upstream switch, and the second downstream switch. As a result, the first upstream switch and the second downstream switch turn on incorrectly, which may cause a large current to flow for a long time.

Accordingly, an object is to provide a drive device in which a large current does not flow for a long period of time even when switching is performed erroneously.

SUMMARY

A drive device according to one aspect of the present disclosure is a drive device that drives a load. The drive device includes: a first upstream switch disposed upstream from the load in a first current path of current flowing via the load; a first downstream switch disposed downstream from the load in the first current path; a second upstream switch disposed upstream from the load in a second current path of current flowing via the load; a second downstream switch disposed downstream from the load in the second current path; a current detection circuit that detects current flowing via the first upstream switch; and a stop circuit that stops flow of the current via the first upstream switch when the current detected by the current detection circuit becomes greater than or equal to a current threshold. A direction of the current flowing in the load when current is flowing in the first current path is different from a direction of the current flowing in the load when current is flowing in the second current path.

Effects of the Present Disclosure

According to the present disclosure, a large current does not flow for a long period of time even when switching is performed erroneously.

DETAILED DESCRIPTION OF PREFERRED EMBODIMENTS

Figure 1:
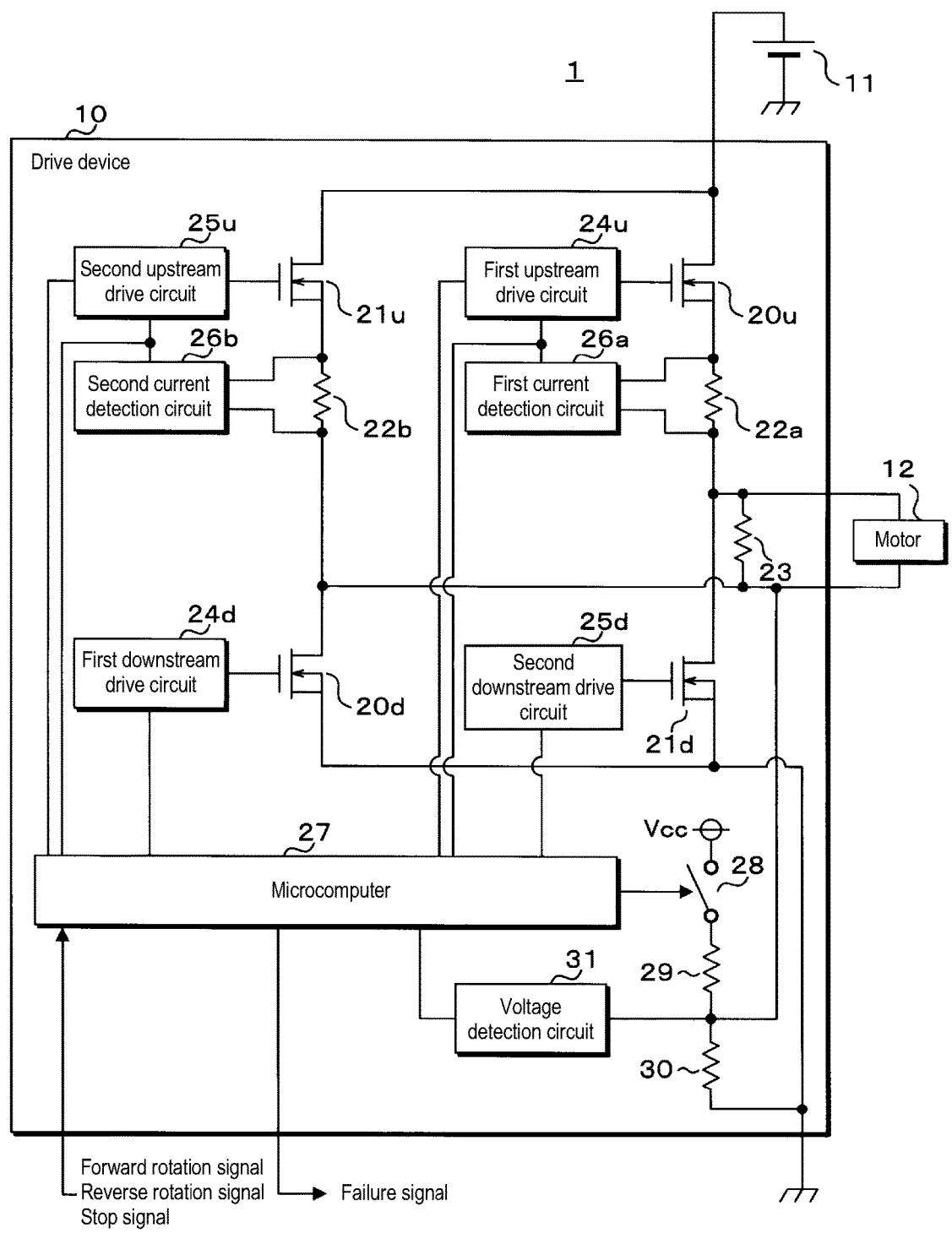
FIG. 1 is a block diagram illustrating the primary configuration of a power supply system according to a first embodiment.

First, embodiments of the present disclosure will be described as examples. The embodiments described hereinafter may be at least partially combined as desired.

A drive device according to one aspect of the present disclosure is a drive device that drives a load. The drive device includes: a first upstream switch disposed upstream from the load in a first current path of current flowing via the load; a first downstream switch disposed downstream from the load in the first current path; a second upstream switch disposed upstream from the load in a second current path of current flowing via the load; a second downstream switch disposed downstream from the load in the second current path; a current detection circuit that detects current flowing via the first upstream switch; and a stop circuit that stops flow of the current via the first upstream switch when the current detected by the current detection circuit becomes greater than or equal to a current threshold. A direction of the current flowing in the load when current is flowing in the first current path is different from a direction of the current flowing in the load when current is flowing in the second current path.

In the foregoing aspect, if the first upstream switch and the second downstream switch are mistakenly switched on, a large current flows via the first upstream switch. At this time, the current flowing through the first upstream switch becomes greater than or equal to the current threshold, and the flow of current via the first upstream switch therefore stops immediately. For this reason, a large current does not flow via the first upstream switch for a long time.

A drive device according to one aspect of the present disclosure includes: a second current detection circuit that detects current flowing via the second upstream switch; and a second stop circuit that stops flow of the current via the second upstream switch when the current detected by the second current detection circuit becomes greater than or equal to a second current threshold.

In the foregoing aspect, if the second upstream switch and the first downstream switch are mistakenly switched on, a large current flows through the second upstream switch. At this time, the current flowing through the second upstream switch becomes greater than or equal to the second current threshold, and the flow of current via the second upstream switch therefore stops immediately. For this reason, a large current also does not flow via the second upstream switch for a long time.

In a drive device according to one aspect of the present disclosure, the stop circuit and the second stop circuit switch the first upstream switch and the second upstream switch off, respectively.

In the foregoing aspect, the flow of current via the first upstream switch or the second upstream switch stops by the first upstream switch or the second upstream switch turning off.

A drive device according to one aspect of the present disclosure includes: a series circuit in which a first resistor, a second resistor, and a circuit switch are connected in series, a connection node between the first resistor and the second resistor is connected to a connection node between the load, the first downstream switch, and the second upstream switch, and to which a constant voltage is applied; a voltage detection circuit that detects a voltage at the connection node between the first resistor and the second resistor; and a processing unit that executes processing. The processing unit executes processing of: switching the circuit switch on or off, and detecting a failure in circuitry that drives the load on the basis of the voltage detected by the voltage detection circuit in an off instruction state in which turning off of the first upstream switch, the first downstream switch, the second upstream switch, and the second downstream switch is instructed.

In the foregoing aspect, when the first upstream switch, the first downstream switch, the second upstream switch, and the second downstream switch are off, the voltage detection circuit detects a voltage divided by the first resistor and the second resistor when the circuit switch is on. When the first upstream switch, the first downstream switch, the second upstream switch, and the second downstream switch are off, the voltage detection circuit detects 0 V or a constant voltage applied to the series circuit, when the circuit switch is off. A failure is detected in the circuitry that drives the load when the voltage detected by the voltage detection circuit is an abnormal voltage in an off instruction state in which turning off of the first upstream switch, the first downstream switch, the second upstream switch, and the second downstream switch is instructed.

In a drive device according to one aspect of the present disclosure, the circuit switch is disposed upstream from the first resistor or the second resistor, the connection node to which the voltage detection circuit is connected is located downstream from the circuit switch, and the processing unit executes processing of: switching the circuit switch off, and detecting a failure in the circuitry that drives the load when the voltage detected by the voltage detection circuit in the off instruction state is greater than or equal to a predetermined voltage, and the predetermined voltage is higher than 0 V.

In the foregoing aspect, when the first upstream switch, the first downstream switch, the second upstream switch, and the second downstream switch are off, the voltage detection circuit detects 0 V when the circuit switch is off. A failure is detected in the circuitry that drives the load when the voltage detected by the voltage detection circuit when the circuit switch is off in the off instruction state is greater than or equal to a predetermined voltage.

In a drive device according to one aspect of the present disclosure, the processing unit executes processing of: switching the circuit switch on; and detecting a failure in the circuitry that drives the load when the voltage detected by the voltage detection circuit in the off instruction state is less than the second predetermined voltage, and the second predetermined voltage is less than or equal to a voltage obtained by the first resistor and the second resistor dividing the constant voltage.

In the foregoing aspect, as described earlier, when the first upstream switch, the first downstream switch, the second upstream switch, and the second downstream switch are off, the voltage detection circuit detects a voltage divided by the first resistor and the second resistor when the circuit switch is on. Accordingly, normally, the voltage detected by the voltage detection circuit is greater than or equal to the second predetermined voltage. A failure is detected in the circuitry that drives the load when the voltage detected by the voltage detection circuit when the circuit switch is on in the off instruction state is less than the second predetermined voltage.

In a drive device according to one aspect of the present disclosure, the processing unit executes processing of detecting a failure in the circuitry that drives the load on the basis of the voltage detected by the voltage detection circuit when the circuit switch is off while switching on of the first upstream switch and the first downstream switch is instructed and switching off of the second upstream switch and the second downstream switch is instructed or when the circuit switch is off while switching on of the second upstream switch and the second downstream switch is instructed and switching off of the first upstream switch and the first downstream switch is instructed.

In the foregoing aspect, the voltage detection circuit detects a low voltage when the circuit switch is off while the first upstream switch and the first downstream switch are on and the second upstream switch and the second downstream switch are off. Accordingly, when the circuit switch is off while switching on of the first upstream switch and the first downstream switch is instructed and switching off of the second upstream switch and the second downstream switch is instructed, a failure in the circuitry that drives the load is detected when the voltage detected by the voltage detection circuit is high.

When the circuit switch is off while the second upstream switch and the second downstream switch are on and the first upstream switch and the first downstream switch are off, the voltage detection circuit detects a high voltage. Accordingly, when the circuit switch is off while switching on of the second upstream switch and the second downstream switch is instructed and switching off of the first upstream switch and the first downstream switch is instructed, a failure in the circuitry that drives the load is detected when the voltage detected by the voltage detection circuit is low.

A drive device according to one aspect of the present disclosure includes a processing unit that executes processing, and the processing unit executes processing of detecting a failure in circuitry that drives the load when the current detected by the current detection circuit is less than the predetermined current while switching on of the first upstream switch and the first downstream switch is instructed.

In the foregoing aspect, a failure is detected in the circuitry that drives the load when the current flowing through the first current path is low, despite switching on of the first upstream switch and the first downstream switch being instructed.

The drive device according to one aspect of the present disclosure includes a processing unit that executes processing. The load is a motor, and the processing unit executes processing of; obtaining rotation information pertaining to rotation of the motor in a state where switching on of the first upstream switch and the first downstream switch is instructed or switching off of the second upstream switch and the second downstream switch is instructed; determining whether or not the load is rotating on the basis of the rotation information obtained; and detecting a failure in circuitry that drives the load when the load is determined not to be rotating.

In the foregoing aspect, the motor rotates when the first upstream switch and the first downstream switch are on or when the second upstream switch and the second downstream switch are on. A failure is detected in the circuitry that drives the load when the motor is not running, despite switching on of the first upstream switch and the first downstream switch being instructed or switching on of the second upstream switch and the second downstream switch being instructed.

Specific examples of the power supply system according to embodiments of the present disclosure will be described hereinafter with reference to the drawings. Note that the present disclosure is not intended to be limited to these examples, and is defined instead by the scope of the appended claims. All changes that fall within the same essential spirit as the scope of the claims are intended to be included therein as well.

First Embodiment

Configuration of Power Supply System

FIG. 1 is a block diagram illustrating the primary configuration of a power supply system 1 according to a first embodiment. The power supply system 1 is preferably installed in a vehicle, and includes a drive device 10, a battery 11, and a motor 12. A positive terminal of the battery 11 and both ends of the motor 12 are connected to the drive device 10 separately. The drive device 10 and a negative terminal of the battery 11 are grounded.

The drive device 10 controls the supply of power from the battery 11 to the motor 12, and also controls the direction of current flowing through the motor 12. When power is supplied to the motor 12, the motor 12 rotates. Rotation of the motor 12 specifically refers to the rotation of a rotor included in the motor 12. The motor 12 opens and closes a window of the vehicle, for example. The drive device 10 drives the motor 12. The motor 12 is one of loads driven by the drive device 10.

The drive device 10 supplies power to the motor 12 and controls the direction of the current flowing through the motor 12 in a first current direction, e.g., the downward direction in FIG. 1. At this time, the motor 12 rotates in the forward direction, and for example, the window is opened. The drive device 10 supplies power to the motor 12 and controls the direction of the current flowing through the motor 12 in a second current direction, e.g., the upward direction in FIG. 1. At this time, the motor 12 rotates in the reverse direction, and for example, the window is closed. The drive device 10 stops supplying power to the motor 12. This causes the motor 12 to stop operating.

Configuration of Drive Device 10

The drive device 10 includes a first upstream switch 20u, a first downstream switch 20d, a second upstream switch 21u, a second downstream switch 21d, shunt resistors 22a and 22b, a load resistor 23, a first upstream drive circuit 24u, a first downstream drive circuit 24d, a second upstream drive circuit 25u, a second downstream drive circuit 25d, a first current detection circuit 26a, a second current detection circuit 26b, a microcomputer 27, a diagnostic switch 28, diagnostic resistors 29 and 30, and a voltage detection circuit 31. The first upstream switch 20u, the first downstream switch 20d, the second upstream switch 21u, and the second downstream switch 21d are N-channel Field Effect Transistors (FETs).

The drain of the first upstream switch 20u is connected to the positive terminal of the battery 11. The source of the first upstream switch 20u is connected to one end of the shunt resistor 22a. The other end of the shunt resistor 22a is connected to one end of the motor 12 and the load resistor 23. The other end of the motor 12 and the load resistor 23 are connected to the drain of the first downstream switch 20d. The source of the first downstream switch 20d is grounded.

The gates of the first upstream switch 20u and the first downstream switch 20d are connected to the first upstream drive circuit 24u and the first downstream drive circuit 24d, respectively. Both ends of the shunt resistor 22a are connected to the first current detection circuit 26a separately. The first current detection circuit 26a is connected to the first upstream drive circuit 24u and the microcomputer 27. The first upstream drive circuit 24u and the first downstream drive circuit 24d are further connected to the microcomputer 27 separately.

Likewise, the drain of the second upstream switch 21u is connected to the positive terminal of the battery 11. The source of the second upstream switch 21u is connected to one end of the shunt resistor 22b. The other end of the shunt resistor 22b is connected to the other end of the motor 12 and the load resistor 23. The motor 12 and one end of the load resistor 23 are connected to the drain of the second downstream switch 21d. The source of the second downstream switch 21d is grounded.

The gates of the second upstream switch 21u and the second downstream switch 21d are connected to the second upstream drive circuit 25u and the second downstream drive circuit 25d, respectively. Both ends of the shunt resistor 22b are connected to the second current detection circuit 26b separately. The second current detection circuit 26b is connected to the second upstream drive circuit 25u and the microcomputer 27. The second upstream drive circuit 25u and the second downstream drive circuit 25d are further connected to the microcomputer 27 separately.

A constant voltage Vcc is applied to one end of the diagnostic switch 28. The other end of the diagnostic switch 28 is connected to one end of the diagnostic resistor 29. The other end of the diagnostic resistor 29 is connected to one end of the diagnostic resistor 30. The other end of the diagnostic resistor 30 is grounded.

As described above, the diagnostic switch 28 and the diagnostic resistors 29 and 30 are connected in series, and the diagnostic switch 28 and the diagnostic resistors 29 and 30 constitute a series circuit. The constant voltage Vcc is applied to this series circuit. The diagnostic switch 28 and the diagnostic resistors 29 and 30 function as a circuit switch, a first resistor, and a second resistor, respectively.

A connection node between the diagnostic resistors 29 and 30 is connected to the motor 12 and the other end of the load resistor 23, and to the voltage detection circuit 31. Accordingly, the connection node between the diagnostic resistors 29 and 30 is connected to a connection node between the motor 12, the load resistor 23, the first downstream switch 20d, and the second upstream switch 21u. The voltage detection circuit 31 is further connected to the microcomputer 27.

The first upstream switch 20u, the first downstream switch 20d, the second upstream switch 21u, and the second downstream switch 21d are each on when the voltage at the gate, with respect to the potential at the source, is greater than or equal to a set value. At this time, current can flow via the drain and the source. The first upstream switch 20u, the first downstream switch 20d, the second upstream switch 21u, and the second downstream switch 21d are each off when the voltage at the gate, with respect to the potential at the source, is less than the set value. At this time, current does not flow via the drain and the source.

The microcomputer 27 outputs an on instruction instructing switching on and an off instruction instructing switching off to each of the first upstream drive circuit 24u, the first downstream drive circuit 24d, the second upstream drive circuit 25u, and the second downstream drive circuit 25d.

The first upstream drive circuit 24u increases the voltage at the gate of the first upstream switch 20u with respect to a ground potential when an on instruction is input. As a result, in the first upstream switch 20u, the voltage at the gate with respect to the potential at the source rises to a voltage greater than or equal to the set value, and the first upstream switch 20u switches on. The first upstream drive circuit 24u reduces the voltage at the gate of the first upstream switch 20u with respect to the ground potential when an off instruction is input. As a result, in the first upstream switch 20u, the voltage at the gate with respect to the potential at the source drops to a voltage less than the set value, and the first upstream switch 20u switches off. As described above, the first upstream drive circuit 24u switches the first upstream switch 20u on or off according to the instruction input from the microcomputer 27.

Like the first upstream drive circuit 24u, the first downstream drive circuit 24d, the second upstream drive circuit 25u, and the second downstream drive circuit 25d switch the first downstream switch 20d, the second upstream switch 21u, and the second downstream switch 21d, respectively, on or off according to the instruction input from the microcomputer 27.

When the second upstream switch 21u and the second downstream switch 21d are off, and the first upstream drive circuit 24u and the first downstream drive circuit 24d switch the first upstream switch 20u and the first downstream switch 20d on, current flows from the positive terminal of the battery 11 to the first upstream switch 20u and the shunt resistor 22a in that order, and then is input to one end of the motor 12 and the load resistor 23. The current output from the other end of the motor 12 and the load resistor 23 flows through the first downstream switch 20d and returns to the negative terminal of the battery 11. At this time, the current flows in the first current direction in the motor 12. As a result, power is supplied to the motor 12, and the motor 12 rotates in the forward direction.

As described above, when the first upstream switch 20u and the first downstream switch 20d are on, current flows through the shunt resistor 22a. The first current detection circuit 26a detects the current flowing through the shunt resistor 22a, i.e., first current flowing via the first upstream switch 20u. The first current detection circuit 26a outputs first current information indicating the detected first current to the first upstream drive circuit 24u and the microcomputer 27. The first current information is, for example, a voltage proportional to the first current. The first current information output by the first current detection circuit 26a is an analog value.

While the first current indicated by the first current information input from the first current detection circuit 26a to the first upstream drive circuit 24u is less than a first current threshold, the first upstream drive circuit 24u switches the first upstream switch 20u on or off according to the instruction input from the microcomputer 27. When the first current indicated by the first current information input from the first current detection circuit 26a to the first upstream drive circuit 24u becomes greater than or equal to the first current threshold, the first upstream drive circuit 24u switches the first upstream switch 20u off and keeps the first upstream switch 20u off regardless of the instruction input from the microcomputer 27. As a result, the flow of current via the first upstream switch 20u stops. The first upstream drive circuit 24u functions as a stop circuit. The first current threshold is greater than the current flowing through the shunt resistor 22a when the first upstream switch 20u and the first downstream switch 20d are on and the second upstream switch 21u and the second downstream switch 21d are off.

The path of the current flowing from the positive terminal of the battery 11 to the first upstream switch 20u, the shunt resistor 22a, the motor 12, and the first downstream switch 20d in that order corresponds to the first current path. In the first current path, the first upstream switch 20u is disposed upstream from the motor 12, and the first downstream switch 20d is disposed downstream from the motor 12.

When the first upstream switch 20u and the first downstream switch 20d are off, and the second upstream drive circuit 25u and the second downstream drive circuit 25d switch the second upstream switch 21u and the second downstream switch 21d on, the current flows from the positive terminal of the battery 11 to the second upstream switch 21u and the shunt resistor 22b in that order, and is then input to the other end of the motor 12 and the load resistor 23. The current output from the one end of the motor 12 and the load resistor 23 flows through the second downstream switch 21d and returns to the negative terminal of the battery 11. At this time, the current flows in the second current direction in the motor 12. As a result, power is supplied to the motor 12, and the motor 12 rotates in the reverse direction.

As described above, when the second upstream switch 21u and the second downstream switch 21d are on, current flows through the shunt resistor 22b. The second current detection circuit 26b detects the current flowing through the shunt resistor 22b, i.e., second current flowing via the second upstream switch 21u. The second current detection circuit 26b outputs second current information indicating the detected second current to the second upstream drive circuit 25u and the microcomputer 27. The second current information is, for example, a voltage proportional to the current flowing through the shunt resistor 22b. The second current information output by the second current detection circuit 26b is an analog value.

While the current indicated by the second current information input from the second current detection circuit 26b to the second upstream drive circuit 25u is less than a second current threshold, the second upstream drive circuit 25u switches the second upstream switch 21u on or off according to the instruction input from the microcomputer 27. When the second current indicated by the second current information input from the second current detection circuit 26b to the second upstream drive circuit 25u becomes greater than or equal to the second current threshold, the second upstream drive circuit 25u switches the second upstream switch 21u off and keeps the second upstream switch 21u off regardless of the instruction input from the microcomputer 27. As a result, the flow of current via the second upstream switch 21u stops. The second upstream drive circuit 25u functions as a second stop circuit. The second current threshold is greater than the current flowing through the shunt resistor 22b when the second upstream switch 21u and the second downstream switch 21d are on and the first upstream switch 20u and the first downstream switch 20d are off.

The path of the current flowing from the positive terminal of the battery 11 to the second upstream switch 21u, the shunt resistor 22b, the motor 12, and the second downstream switch 21d in that order corresponds to the second current path. In the second current path, the second upstream switch 21u is disposed upstream from the motor 12, and the second downstream switch 21d is disposed downstream from the motor 12. When current is flowing through the first current path, the direction of the current flowing through the motor 12 is the first current direction. When current is flowing through the second current path, the direction of the current flowing through the motor 12 is the second current direction, which is different from the first current direction.

The microcomputer 27 switches the diagnostic switch 28 on or off. When the diagnostic switch 28 is on, current flows through the diagnostic switch 28 and the diagnostic resistors 29 and 30 in that order. Accordingly, the diagnostic switch 28 is disposed upstream from the diagnostic resistors 29 and 30, and the connection node to which the voltage detection circuit 31 is connected is located downstream from the diagnostic switch 28. The diagnostic resistors 29 and 30 divide the constant voltage Vcc. The voltage detection circuit 31 detects the voltage at the connection node between the diagnostic resistors 29 and 30 with respect to the ground potential, and outputs voltage information indicating the detected detection voltage to the microcomputer 27. The voltage information is, for example, a voltage proportional to the detection voltage detected by the voltage detection circuit 31. The voltage information output by the voltage detection circuit 31 is an analog value.

A forward rotation signal instructing rotation of the motor 12 in the forward direction, a reverse rotation signal instructing rotation of the motor 12 in the reverse direction, and a stop signal instructing stopping of the motor 12 are input to the microcomputer 27.

When the forward rotation signal is input to the microcomputer 27, the microcomputer 27 outputs an on instruction to the first upstream drive circuit 24u and the first downstream drive circuit 24d. As a result, the first upstream drive circuit 24u and the first downstream drive circuit 24d switch the first upstream switch 20u and the first downstream switch 20d on, respectively. As a result, current in the first current direction flows through the motor 12, and the motor 12 rotates in the forward direction.

When the reverse rotation signal is input to the microcomputer 27, the microcomputer 27 outputs an on instruction to the second upstream drive circuit 25u and the second downstream drive circuit 25d. As a result, the second upstream drive circuit 25u and the second downstream drive circuit 25d switch the second upstream switch 21u and the second downstream switch 21d on, respectively. As a result, current in the second current direction flows through the motor 12, and the motor 12 rotates in the reverse direction.

When the stop signal is input to the microcomputer 27, the microcomputer 27 outputs an off instruction to the first upstream drive circuit 24u and the second upstream drive circuit 25u. As a result, the first upstream drive circuit 24u and the second upstream drive circuit 25u switch the first upstream switch 20u and the second upstream switch 21u off, respectively. As a result, the supply of power to the motor 12 stops and the motor 12 stops operating.

The microcomputer 27 outputs an off instruction to the first upstream drive circuit 24u and the second upstream drive circuit 25u, and then outputs an on instruction to the first downstream drive circuit 24d and the second downstream drive circuit 25d. As a result, the first downstream drive circuit 24d and the second downstream drive circuit 25d switch the first downstream switch 20d and the second downstream switch 21d on, respectively, while the first upstream switch 20u and the second upstream switch 21u are off. The motor 12 includes an inductor. While the motor 12 is operating, current flows via the inductor in the motor 12, and energy is stored in the inductor.

While the first upstream switch 20u and the second upstream switch 21u are off, and the first downstream switch 20d and the second downstream switch 21d are on, current flows from the inductor of the motor 12 via the first downstream switch 20d and the second downstream switch 21d. As a result, the inductor releases the stored energy.

The microcomputer 27 outputs an off instruction to the first downstream drive circuit 24d and the second downstream drive circuit 25d after a set period has passed following the output of an on instruction to the first downstream drive circuit 24d and the second downstream drive circuit 25d. As a result, with the first upstream switch 20u and the second upstream switch 21u off, the first downstream drive circuit 24d and the second downstream drive circuit 25d switch the first downstream switch 20d and the second downstream switch 21d off, respectively.

The microcomputer 27 detects failures in the circuitry that drives the motor 12 on the basis of the first current information, the second current information, and the voltage information input from the first current detection circuit 26a, the second current detection circuit 26b, and the voltage detection circuit 31. When a failure is detected, the microcomputer 27 outputs a failure signal indicating the failure of the circuitry that drives the motor 12. The failure is reported as a result.

Configuration of Microcomputer 27

Figure 2:
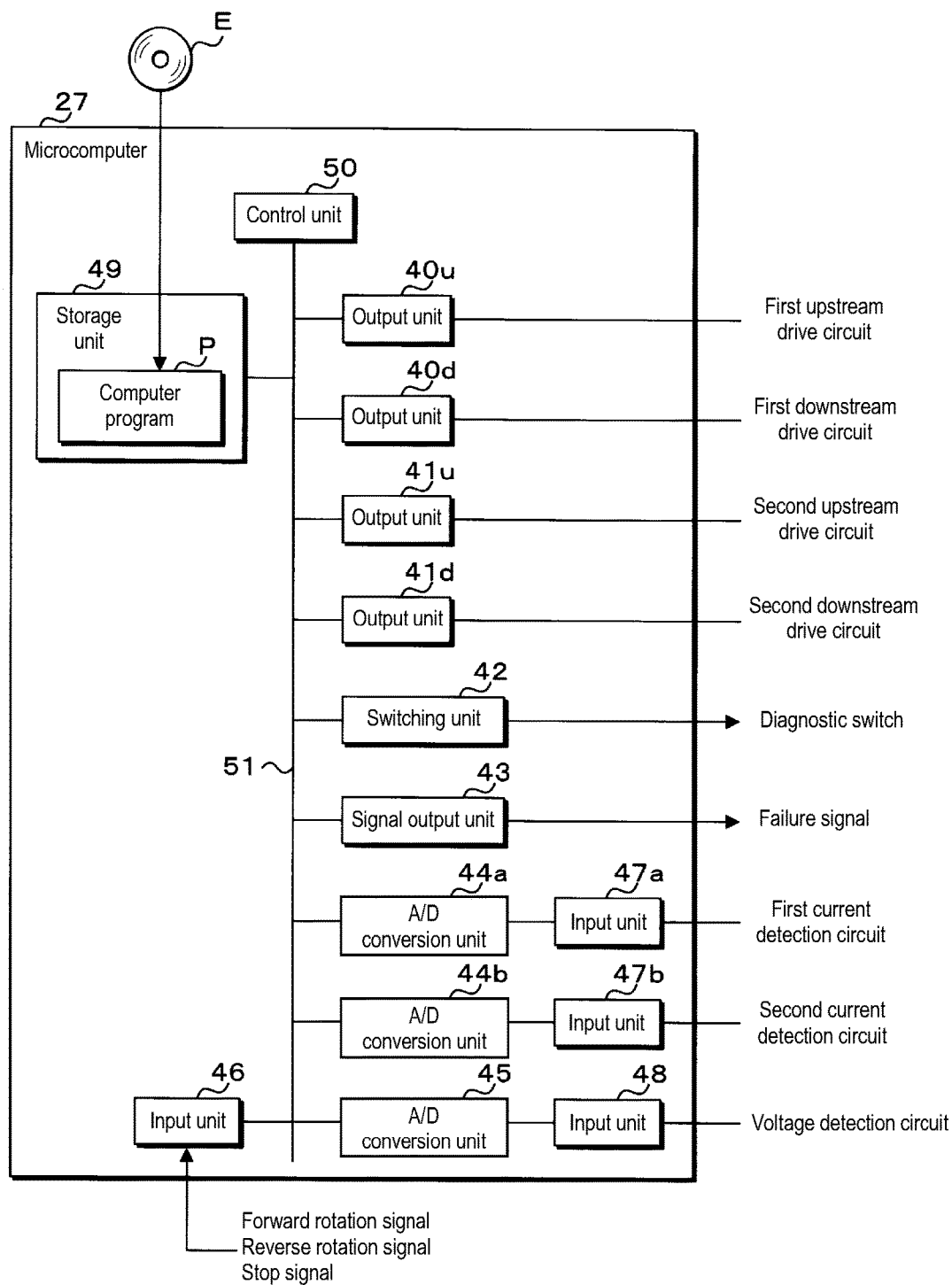
FIG. 2 is a block diagram illustrating the primary configuration of a microcomputer.

FIG. 2 is a block diagram illustrating the primary configuration of the microcomputer 27. The microcomputer 27 includes output units 40u, 40d, 41u, and 41d, a switching unit 42, a signal output unit 43, A/D conversion units 44a, 44b, and 45, input units 46, 47a, 47b, and 48, a storage unit 49, and a control unit 50. The output units 40u, 40d, 41u, and 41d, the switching unit 42, the signal output unit 43, the A/D conversion units 44a, 44b, and 45, the input unit 46, the storage unit 49, and the control unit 50 are connected to an internal bus 51.

The output units 40u, 40d, 41u, and 41d are further connected to the first upstream drive circuit 24u, the first downstream drive circuit 24d, the second upstream drive circuit 25u, and the second downstream drive circuit 25d, respectively. The A/D conversion units 44a, 44b, and 45 are further connected to the input units 47a, 47b, and 48, respectively. The input units 47a, 47b, and 48 are further connected to the first current detection circuit 26a, the second current detection circuit 26b, and the voltage detection circuit 31, respectively.

The output units 40u, 40d, 41u, and 41d respectively output an on instruction or an off instruction to the first upstream drive circuit 24u, the first downstream drive circuit 24d, the second upstream drive circuit 25u, and the second downstream drive circuit 25d, according to instructions from the control unit 50. The switching unit 42 switches the diagnostic switch 28 on or off according to an instruction from the control unit 50. The signal output unit 43 outputs the failure signal according to an instruction from the control unit 50.

The analog first current information is input from the first current detection circuit 26a to the input unit 47a. The input unit 47a outputs the analog first current information input from the first current detection circuit 26a to the A/D conversion unit 44a. The A/D conversion unit 44a converts the analog first current information input from the input unit 47a into digital first current information. The control unit 50 obtains the digital first current information from the A/D conversion unit 44a. The first current indicated by the first current information obtained by the control unit 50 is substantially the same as the first current detected by the first current detection circuit 26a at the time of the obtainment.

Likewise, the analog second current information is input from the second current detection circuit 26b to the input unit 47b. The input unit 47b outputs the analog second current information input from the second current detection circuit 26b to the A/D conversion unit 44b. The A/D conversion unit 44b converts the analog second current information input from the input unit 47b into digital second current information. The control unit 50 obtains the digital second current information from the A/D conversion unit 44b. The second current indicated by the second current information obtained by the control unit 50 is substantially the same as the second current detected by the second current detection circuit 26b at the time of the obtainment.

The analog voltage information is input from the voltage detection circuit 31 to the input unit 48. The input unit 48 outputs, to the A/D conversion unit 45, the analog voltage information input from the voltage detection circuit 31. The A/D conversion unit 45 converts the analog voltage information input from the input unit 48 into digital voltage information. The detection voltage indicated by the voltage information obtained by the control unit 50 is substantially the same as the detection voltage detected by the voltage detection circuit 31 at the time of the obtainment.

The forward rotation signal, the reverse rotation signal, and the stop signal are input to the input unit 46. When a signal is input to the input unit 46, the input unit 46 notifies the control unit 50 of the signal that has been input.

The storage unit 49 is non-volatile memory. A computer program P is stored in the storage unit 49. The control unit 50 includes a processing device that executes processing, e.g., Central Processing Units (CPUs). The processing device included in the control unit 50 executes motor drive processing, motor stop processing, and open detection processing by executing the computer program P. The control unit 50 therefore functions as a processing unit.

The motor drive processing is processing for driving the motor 12. The motor stop processing is processing for stopping the operation of the motor 12. The open detection processing is processing for detecting an open circuit in the circuitry that drives the motor 12.

The control unit 50 may include two or more of the processing devices. In this case, the plurality of processing devices may cooperatively execute the motor drive processing, the motor stop processing, and the open detection processing.

Note that the computer program P may be provided to the microcomputer 27 using a non-transitory storage medium E that stores the computer program P in a readable state. The storage medium E is portable memory such as, for example, a Compact Disc (CD)-Read Only Memory (ROM), Universal Serial Bus (USB) memory, a Secure Digital (SD) card, a micro SD card, Compact Flash (registered trademark), or the like. In this case, the control unit 50 may read the computer program P from the storage medium E using a reading device (not shown) and install the read computer program P in the storage unit 49. Furthermore, if the microcomputer 27 includes a communication unit that communicates with an external device, the computer program P may be provided to the microcomputer 27 by communication via the communication unit. In this case, the control unit 50 may obtain the computer program P through the communication unit and install the obtained computer program P in the storage unit 49.

A flag value is stored in the storage unit 49. A flag has a value of either 0 or 1. The control unit 50 changes the value of the flag to 0 or 1. The value of the flag being 0 indicates an off instruction state in which off instructions are being output to the first upstream drive circuit 24*u*, the first downstream drive circuit 24*d*, the second upstream drive circuit 25*u*, and the second downstream drive circuit 25*d*. Accordingly, when the drive device 10 is normal and the value of the flag is 0, the motor 12 stops operating.

The value of the flag being 1 indicates an on instruction state in which on instructions are being output to the first upstream drive circuit 24*u* and the first downstream drive circuit 24*d* or on instructions are being output to the second upstream drive circuit 25*u* and the second downstream drive circuit 25*d*. Accordingly, when the drive device 10 is normal and the value of the flag is 1, the motor 12 is rotating in the forward direction or the reverse direction.

Motor Drive Processing

Figure 3:
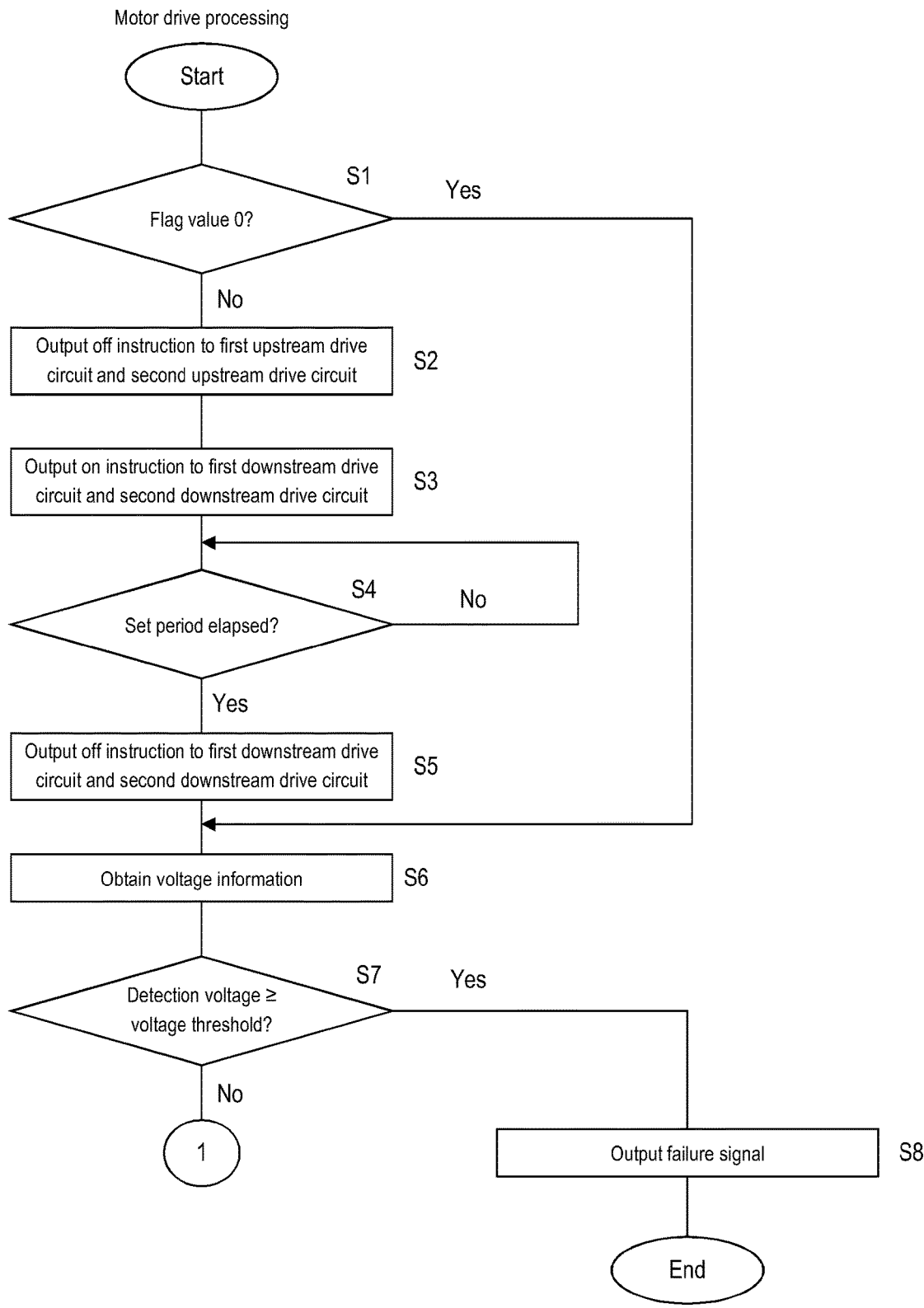
FIG. 3 is a flowchart illustrating a motor drive processing sequence.
Figure 4:
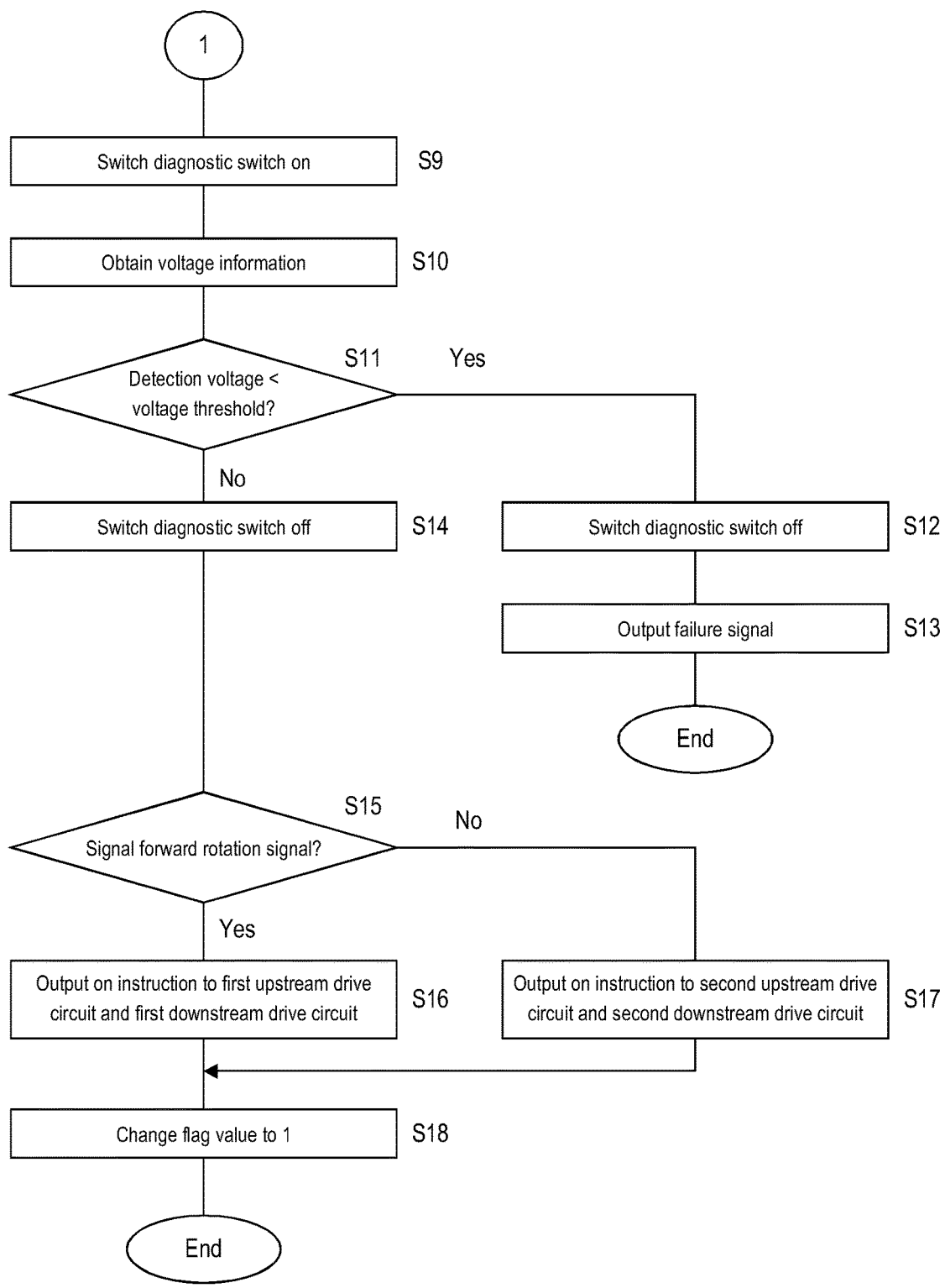
FIG. 4 is a flowchart illustrating a motor drive processing sequence.

FIGS. 3 and 4 are flowcharts illustrating the motor drive processing sequence. When the forward rotation signal or the reverse rotation signal is input to the input unit 46, the control unit 50 executes the motor drive processing. The motor drive processing is executed with the diagnostic switch 28 being off. In the motor drive processing, the control unit 50 first determines whether or not the value of the flag is 0 (step S1).

If it is determined that the value of the flag is not 0, i.e., that the value of the flag is 1 (S1: NO), the control unit 50 instructs the output units 40*u* and 41*u* to output an off instruction to the first upstream drive circuit 24*u* and the second upstream drive circuit 25*u* (step S2). When the drive device 10 is normal, executing step S2 results in the first upstream drive circuit 24*u* and the second upstream drive circuit 25*u* switching the first upstream switch 20*u* and the second upstream switch 21*u* off, respectively, and the motor 12 stops operating.

Next, the control unit 50 instructs the output units 40*d* and 41*d* to output an on instruction to the first downstream drive circuit 24*d* and the second downstream drive circuit 25*d* (step S3). When the drive device 10 is normal, executing step S3 results in the first downstream drive circuit 24*d* and the second downstream drive circuit 25*d* switching the first downstream switch 20*d* and the second downstream switch 21*d* on, respectively. As a result, the inductor included in the motor 12 releases energy.

Next, the control unit 50 determines whether or not a set period set in advance has passed following the execution of step S3 (step S4). The microcomputer 27 may have a timer. In this case, after executing step S3, the control unit 50 starts the timer. In step S4, the control unit 50 determines whether or not the set period has elapsed on the basis of whether or not the time measured by the timer is greater than or equal to the set period. If it is determined that the set period has not elapsed (S4: NO), the control unit 50 executes step S4 again and stands by until the set period has elapsed. The set period is preferably longer than a period in which the inductor releases all of the stored energy.

If it is determined that the set period has elapsed (S4: YES), the control unit 50 causes the output units 40*d* and 41*d* to output an off instruction to the to the first downstream drive circuit 24*d* and second downstream drive circuit 25*d* (step S5). If the timer is measuring time, the control unit 50 causes the timer to end the measurement of time after executing step S5. When the drive device 10 is normal, executing step S5 results in the first downstream drive circuit 24*d* and the second downstream drive circuit 25*d* switching the first downstream switch 20*d* and the second downstream switch 21*d* off, respectively, while the first upstream switch 20*u* and the second upstream switch 21*u* are off. When step S5 is executed, the state of the microcomputer 27 becomes the off instruction state, in which off instructions are output to the first upstream drive circuit 24*u*, the first downstream drive circuit 24*d*, the second upstream drive circuit 25*u*, and the second downstream drive circuit 25*d*.

When the value of the flag is 1 and the forward rotation signal or the reverse rotation signal is input to the input unit 46, the motor drive processing is executed and the control unit 50 changes the direction in which the motor 12 rotates. As described earlier, in the motor drive processing, when the direction in which the motor 12 rotates is changed, i.e., when the value of the flag is 1, steps S2 to S5 are executed, and a period is provided in which the first upstream switch 20*u*, the first downstream switch 20*d*, the second upstream switch 21*u*, and the second downstream switch 21*d* are off. As a result, the first upstream switch 20*u* and the second downstream switch 21*d* are prevented from turning on, or the second upstream switch 21*u* and the first downstream switch 20*d* are prevented from turning on.

If it is determined that the value of the flag is 0 (S1: YES), or after executing step S5, the control unit 50 obtains the voltage information from the A/D conversion unit 45 (step S6). As described earlier, the voltage information indicates the detection voltage detected by the voltage detection circuit 31. When the drive device 10 is normal, no current flows through the diagnostic resistor 30 at the point in time when step S6 is executed. For this reason, the detection voltage indicated by the voltage information obtained by the control unit 50 in step S6 is 0 V.

The resistance value of the diagnostic resistor 30 is sufficiently greater than the resistance values of the shunt resistors 22*a* and 22*b* and the load resistor 23, respectively. Assume that both ends of the first upstream switch 20*u* or the second upstream switch 21*u* are shorted, or that a resistance value between the drain and the source of the first upstream switch 20*u* or the second upstream switch 21*u* is fixed at an undefined magnitude, or that the connection node between the first upstream switch 20*u* and the first downstream switch 20*d*, or between the second upstream switch 21*u* and the second downstream switch 21*d* is in contact with the drain of the first upstream switch 20*u*.

In this case, at the point in time when step S6 is executed, the detection voltage detected by the voltage detection circuit 31 is substantially the same as the voltage between both ends of the battery 11 (called a "battery voltage" hereinafter). A failure in which the resistance value between the drain and the source is fixed at an undefined magnitude is what is known as "half-on". When the first upstream switch 20*u* and the second upstream switch 21*u* are half-on, the resistance value between the drain and the source of the first upstream switch 20*u* and the second upstream switch 21*u*, respectively, is sufficiently lower than the diagnostic resistor 30. A failure in which the connection node between the first upstream switch 20*u* and the first downstream switch 20*d*, or the connection node between the second upstream switch 21*u* and the second downstream switch 21*d* contacts the drain of the first upstream switch 20*u* is a what is known as a "line-to-line fault".

A voltage threshold to be compared with the detection voltage is stored in advance in the storage unit 49. The voltage threshold is a set value and is higher than 0 V. The voltage threshold is less than or equal to the voltage obtained by the diagnostic resistors 29 and 30 dividing the constant voltage Vcc. The constant voltage Vcc is generated by stepping down the battery voltage, and is therefore less than the battery voltage. For this reason, the voltage threshold is less than the battery voltage.

The control unit 50 determines whether or not the detection voltage indicated by the voltage information obtained in step S6 is greater than or equal to the voltage threshold (step S7). The detection voltage being greater than or equal to the voltage threshold means that a failure has occurred in the circuitry that drives the motor 12. By executing step S7, the control unit 50 detects the failure in the circuitry that drives the motor 12. If it is determined that the detection voltage is greater than or equal to the voltage threshold (S7: YES), the control unit 50 instructs the signal output unit 43 to output a failure signal (step S8) under the assumption that a failure has been detected, and ends the motor drive processing. The voltage threshold functions as a predetermined voltage.

If it is determined that the detection voltage is less than the voltage threshold (S7; NO), the control unit 50 instructs the switching unit 42 to switch the diagnostic switch 28 on (step S9) and obtains the voltage information from the A/D conversion unit 45 (step S10).

If the drive device 10 is normal, the diagnostic resistors 29 and 30 are dividing the constant voltage Vcc at the point in time when step S10 is executed. For this reason, the detection voltage indicated by the voltage information obtained in step S10 is the voltage obtained by the division by the diagnostic resistors 29 and 30. For example, if the resistance values of diagnostic resistors 29 and 30 are the same, the detection voltage is (constant voltage Vcc)/2.

As described earlier, the voltage threshold is less than or equal to the voltage obtained by the diagnostic resistors 29 and 30 dividing the constant voltage Vcc. For this reason, when the drive device 10 is normal, the detection voltage indicated by the voltage information obtained by the control unit 50 in step S10 is greater than or equal to the voltage threshold.

Assume that both ends of the first downstream switch 20*d* or the second downstream switch 21*d* are shorted, or that the first downstream switch 20*d* or the second downstream switch 21*d* is half-on; or that the connection node between the first upstream switch 20*u* and the first downstream switch 20*d*, or the connection node between the second upstream switch 21*u* and the second downstream switch 21*d*, is grounded. When the first downstream switch 20*d* and the second downstream switch 21*d* are half-on, the resistance value between the drain and the source of the first downstream switch 20*d* and the second downstream switch 21*d*, respectively, is sufficiently lower than the resistance value of the diagnostic resistor 30. A failure in which the connection node between the first upstream switch 20*u* and the first downstream switch 20*d*, or the connection node between the second upstream switch 21*u* and the second downstream switch 21*d*, is grounded is what is known as a "ground fault".

When both ends of the first downstream switch 20*d* or the second downstream switch 21*d* are shorted, the first downstream switch 20*d* or the second downstream switch 21*d* is half-on, or a ground fault has occurred, the detection voltage detected by the voltage detection circuit 31 is a value close to 0 V and less than the voltage threshold at the point in time when step S10 is executed.

The control unit 50 determines whether or not the detection voltage indicated by the voltage information obtained in step S10 is less than the voltage threshold (step S11). The detection voltage being less than the voltage threshold means that a failure has occurred in the circuitry that drives the motor 12. By executing step S11, the control unit 50 detects the failure in the circuitry that drives the motor 12. If it is determined that the detection voltage is less than the voltage threshold (S11: YES), the control unit 50 causes the switching unit 42 to switch the diagnostic switch 28 off (step S12), and instructs the signal output unit 43 to output a failure signal (step S13) under the assumption that a failure has been detected. The control unit 50 ends the motor drive processing after executing step S13. The voltage threshold also functions as a second predetermined voltage.

If it is determined that the detection voltage is greater than or equal to the voltage threshold (S11: NO), the control unit 50 causes the switching unit 42 to switch the diagnostic switch 28 off (step S14), and determines whether or not the signal input to the input unit 46 is the forward rotation signal (step S15). If it is determined that the signal is the forward rotation signal (S15: YES), the control unit 50 instructs the output units 40*u* and 40*d* to output an on instruction to the first upstream drive circuit 24*u* and the first downstream drive circuit 24*d* (step S16). When the drive device 10 is normal and step S16 is executed, the first upstream switch 20*u* and the first downstream switch 20*d* switch on. As a result, current in the first current direction flows through the motor 12, and the motor 12 rotates in the forward direction.

Note that in step S16, the control unit 50 may keep the output of one of the output units 40*u* and 40*d* fixed to an on instruction, and cause the other of the output units 40*u* and 40*d* to repeatedly output an on instruction and an off instruction in an alternating manner. In this case, one of the first upstream switch 20*u* and the first downstream switch 20*d* switches on and off in an alternating manner, which realizes Pulse Width Modulation (PWM) control. Because the first upstream drive circuit 24*u* has a function for switching the first upstream switch 20*u* off on the basis of the first current detected by the first current detection circuit 26*a*, there is a long time between an on instruction or an off instruction being input to the first upstream drive circuit 24*u* and the first upstream drive circuit 24*u* switching the first upstream switch 20*u* on or off. For this reason, the control unit 50 preferably realizes the PWM control by causing the output unit 40*d* to repeatedly output an on instruction and an off instruction in an alternating manner.

If it is determined that the signal is not the forward rotation signal, i.e., that the signal is the reverse rotation signal (S15: NO), the control unit 50 instructs the output units 41*u* and 41*d* to output an on instruction to the second upstream drive circuit 25*u* and the second downstream drive circuit 25*d* (step S17). When the drive device 10 is normal and step S17 is executed, the second upstream switch 21*u* and the second downstream switch 21*d* switch on. As a result, current in the second current direction flows through the motor 12, and the motor 12 rotates in the reverse direction.

Note that in step S17, the control unit 50 may keep the output of one of the output units 41*u* and 41*d* fixed to an on instruction, and cause the other of the output units 41*u* and 41*d* to repeatedly output an on instruction and an off instruction in an alternating manner. In this case, one of the second upstream switch 21*u* and the second downstream switch 21*d* switches on and off in an alternating manner, which realizes PWM control. Because the second upstream drive circuit 25*u* has a function for switching the second upstream switch 21*u* off on the basis of the second current detected by the second current detection circuit 26*b*, there is a long time between an on instruction or an off instruction being input to the second upstream drive circuit 25*u* and the second upstream drive circuit 25*u* switching the second upstream switch 21*u* on or off. For this reason, the control unit 50 preferably realizes the PWM control by causing the output unit 41d to repeatedly output an on instruction and an off instruction in an alternating manner.

After executing one of steps S16 and S17, the control unit 50 changes the value of the flag to 1 (step S18), and ends the motor drive processing. If the value of the flag is 1 at the point in time when step S18 is executed, the control unit 50 skips step S18. The drive processing ends with the diagnostic switch 28 being off.

Motor Stop Processing

Figure 5:
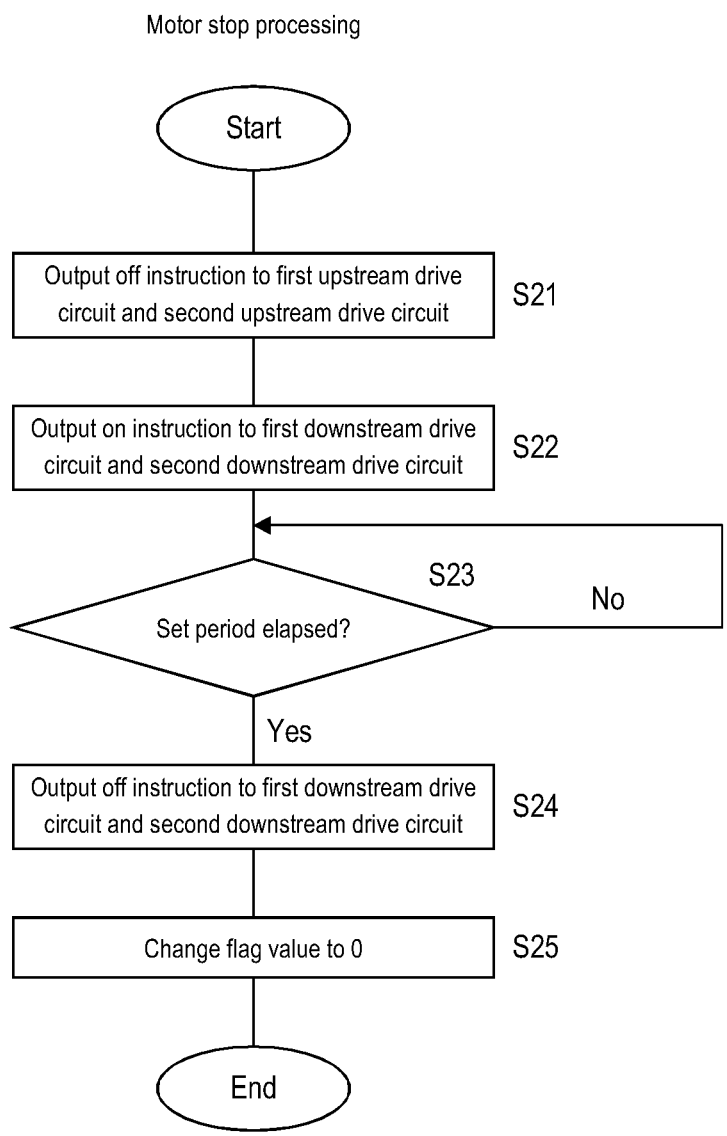
FIG. 5 is a flowchart illustrating a motor stop processing sequence.

FIG. 5 is a flowchart illustrating the motor stop processing sequence. The control unit 50 executes the motor stop processing when the stop signal is input to the input unit 46. In the motor stop processing, the control unit 50 sequentially executes steps S21 to S24. Steps S21 to S24 of the motor stop processing are the same as steps S2 to S5, respectively, of the motor drive processing. For this reason, steps S21 to S24 will not be described in detail.

When the control unit 50 executes steps S21 to S24 while the drive device 10 is in a normal state, first, the first upstream switch 20u and the second upstream switch 21u switch to off, and the operation of the motor 12 stops. Then, the first downstream switch 20d and the second downstream switch 21d remain on for a set period, and the energy stored in the inductor included in the motor 12 is released. After the set period, the second upstream switch 21u and the second downstream switch 21d switch off with the first upstream switch 20u and the second upstream switch 21u being off.

After executing step S24, the control unit 50 changes the value of the flag to 0 (step S25), and ends the motor stop processing. The motor stop processing starts with the diagnostic switch 28 being off, and ends with the diagnostic switch 28 remaining off.

Operations of Drive Device 10

Figure 6:
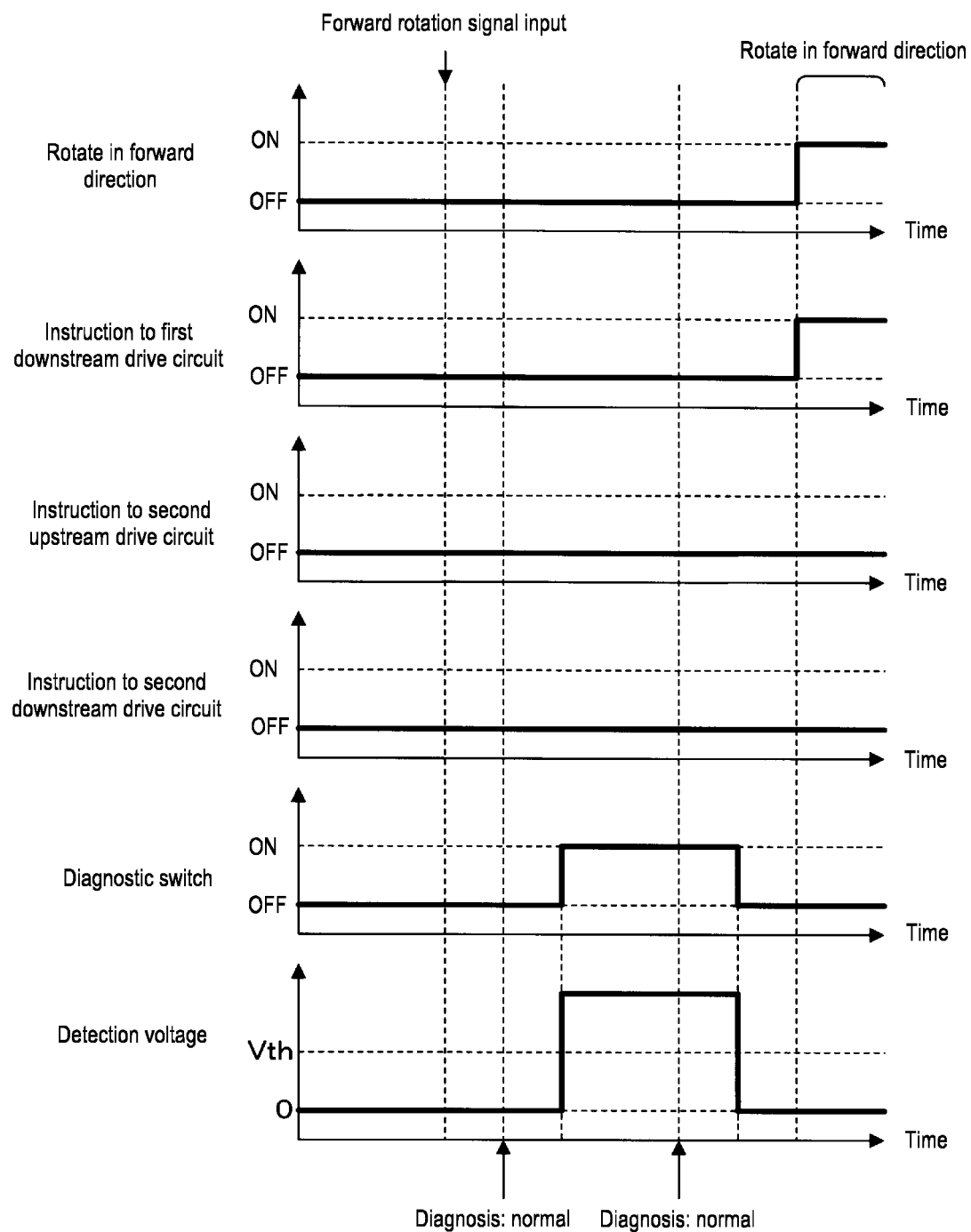
FIG. 6 is a timing chart illustrating operations of a drive device when no failure has occurred.

FIG. 6 is a timing chart illustrating operations of the drive device 10 when no failure has occurred. FIG. 6 illustrates transitions of instructions for the first upstream drive circuit 24u, the first downstream drive circuit 24d, the second upstream drive circuit 25u, and the second downstream drive circuit 25d output by the output units 40u, 40d, 41u, and 41d. FIG. 6 furthermore illustrates transitions of the state of the diagnostic switch 28 and transitions of the detection voltage detected by the voltage detection circuit 31. Vth indicates the voltage threshold.

Assume that the forward rotation signal is input to the input unit 46 of the microcomputer 27 while the value of the flag is 0, i.e., while an off instruction is being output to the first upstream drive circuit 24u, the first downstream drive circuit 24d, the second upstream drive circuit 25u, and the second downstream drive circuit 25d. When the forward rotation signal or the reverse rotation signal is input to the input unit 46, the control unit 50 of the microcomputer 27 executes the motor drive processing. When the diagnostic switch is off, the detection voltage is 0 V, which is less than the voltage threshold Vth. For this reason, the control unit 50 makes a diagnosis that there is no failure, such as a short between both ends of the first upstream switch 20u or the second upstream switch 21u, the first upstream switch 20u or the second upstream switch 21u being half-on, or a line-to-line fault, and that the circuitry that drives the motor 12 is therefore normal.

Next, the control unit 50 instructs the switching unit 42 to switch the diagnostic switch 28 on. When the diagnostic switch 28 is switched on when no failure has occurred in the circuitry that drives the motor 12, the detection voltage rises to the voltage obtained from the division by the diagnostic resistors 29 and 30, and becomes greater than or equal to the voltage threshold Vth. When the diagnostic switch 28 is on, the detection voltage is greater than or equal to the voltage threshold Vth. For this reason, the control unit 50 makes a diagnosis that there is no failure, such as a short between both ends of the first downstream switch 20d or the second downstream switch 21d, the first downstream switch 20d or the second downstream switch 21d being half-on, or a ground fault, and that the circuitry that drives the motor 12 is therefore normal.

If a diagnosis that the circuitry that drives the motor 12 is normal is made, the control unit 50 instructs the switching unit 42 to switch the diagnostic switch 28 off, and instructs the output units 40u and 40d to output an on instruction to the first upstream drive circuit 24u and the first downstream drive circuit 24d. As a result, the first upstream drive circuit 24u and the first downstream drive circuit 24d switch the first upstream switch 20u and the first downstream switch 20d on. As a result, power is supplied to the motor 12, and the motor 12 rotates in the forward direction. The control unit 50 instructs the output units 40u and 40d to output an on instruction, and then ends the motor drive processing.

When the reverse rotation signal is input to the input unit 46 of the microcomputer 27 while the value of the flag is 0, the control unit 50 performs the same processing as when a forward rotation signal is input to the input unit 46 of the microcomputer 27 while the value of the flag is 0. After instructing the switching unit 42 to switch the diagnostic switch 28 off, the control unit 50 instructs the output units 41u and 41d to output an on instruction to the second upstream drive circuit 25u and the second downstream drive circuit 25d. As a result, the second upstream drive circuit 25u and the second downstream drive circuit 25d switch the second upstream switch 21u and the second downstream switch 21d on. As a result, power is supplied to the motor 12, and the motor 12 rotates in the reverse direction. The control unit 50 instructs the output units 41u and 41d to output an on instruction, and then ends the motor drive processing.

Figure 7:
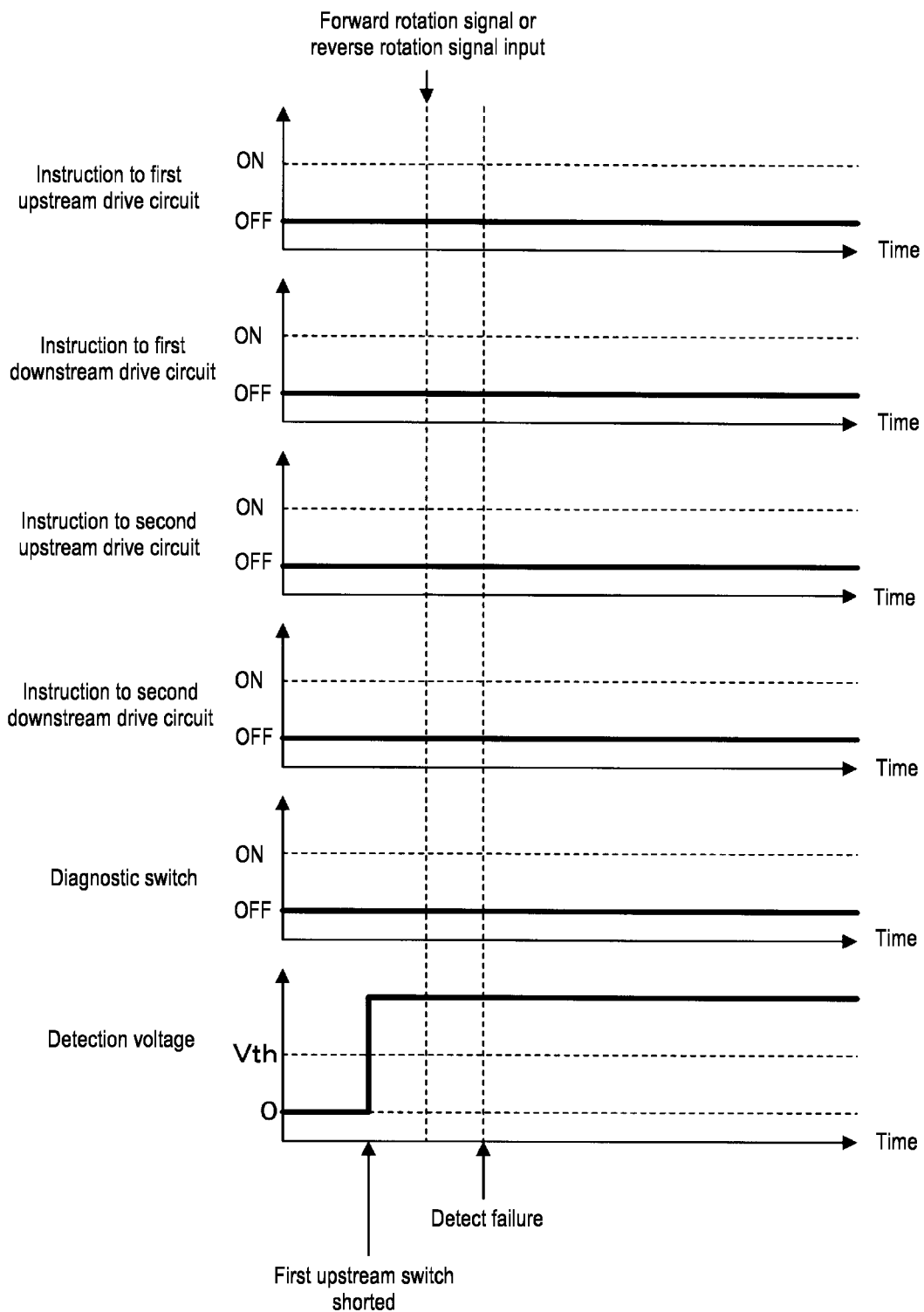
FIG. 7 is a timing chart illustrating operations of the drive device when both ends of a first upstream switch are shorted.

FIG. 7 is a timing chart illustrating operations of the drive device 10 when both ends of the first upstream switch 20u are shorted. As in FIG. 6, transitions of instructions for the first upstream drive circuit 24u, the first downstream drive circuit 24d, the second upstream drive circuit 25u, and the second downstream drive circuit 25d, transitions of the state of the diagnostic switch 28, and transitions of the detection voltage detected by the voltage detection circuit 31 are illustrated.

Assume that both ends of the first upstream switch 20u are shorted while the value of the flag is 0. In this case, the detection voltage rises to a voltage that is substantially the same as the battery voltage, and becomes greater than or equal to the voltage threshold Vth. When the forward rotation signal or the reverse rotation signal is input to the input unit 46, the control unit 50 executes the motor drive processing. In the motor drive processing, diagnosis is performed in a state where the value of the flag is 0 and the diagnostic switch 28 is off. Here, the detection voltage is greater than or equal to the voltage threshold Vth, and thus the control unit 50 detects a failure such as a short between both ends of the first upstream switch 20u or the second upstream switch 21u, the first downstream switch 20d or the second downstream switch 21d being half-on, or a line-to-line fault. In this case, the control unit 50 ends the motor drive processing with the instructions output by the output units 40u, 40d, 41u, and 41d maintained as off instructions.

When a failure such as a short between both ends of the second upstream switch 21u, the first downstream switch 20d or the second downstream switch 21d being half-on, or a line-to-line fault has occurred while the value of the flag is 0, the control unit 50 performs the same processing as when a short has occurred between both ends of the first upstream switch 20u while the value of the flag is 0.

Figure 8:
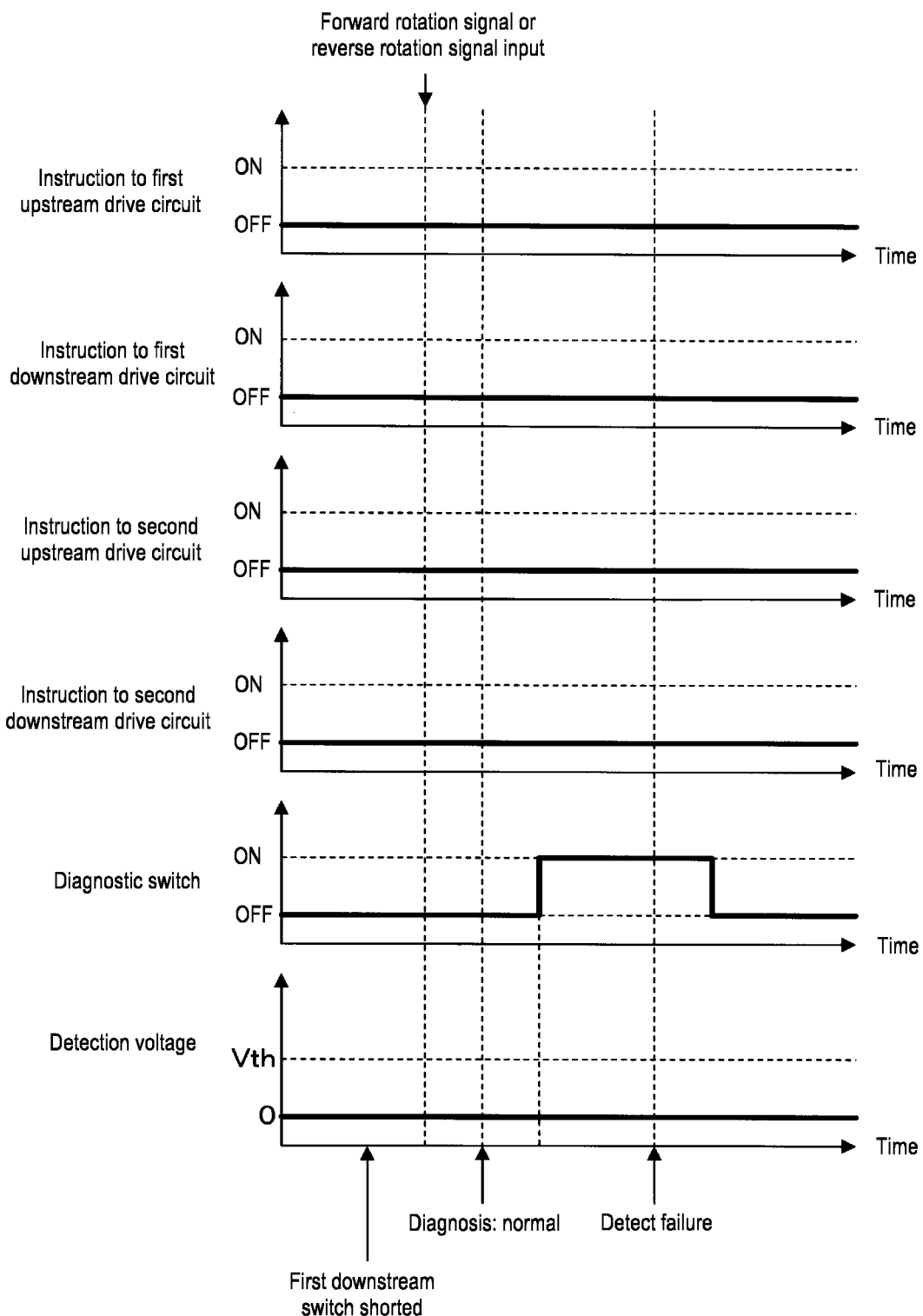
FIG. 8 is a timing chart illustrating operations of the drive device when both ends of a first downstream switch are shorted.

FIG. 8 is a timing chart illustrating operations of the drive device 10 when both ends of the first downstream switch 20d are shorted. As in FIG. 6, transitions of instructions for the first upstream drive circuit 24u, the first downstream drive circuit 24d, the second upstream drive circuit 25u, and the second downstream drive circuit 25d, transitions of the state of the diagnostic switch 28, and transitions of the detection voltage detected by the voltage detection circuit 31 are illustrated.

Assume that both ends of the first downstream switch 20d are shorted while the value of the flag is 0. In this case, the detection voltage is kept at 0 V. When the forward rotation signal or the reverse rotation signal is input to the input unit 46, the control unit 50 executes the motor drive processing. In the motor drive processing, diagnosis is performed in a state where the value of the flag is 0 and the diagnostic switch 28 is off. Here, the detection voltage is less than the voltage threshold Vth, and thus the control unit 50 makes a diagnosis that there is no failure, such as a short between both ends of the first upstream switch 20u or the second upstream switch 21u, the first downstream switch 20d or the second downstream switch 21d being half-on, or a line-to-line fault, and that the circuitry that drives the motor 12 is therefore normal.

Next, the control unit 50 instructs the switching unit 42 to switch the diagnostic switch 28 on. Here, both ends of the first downstream switch 20d are shorted, and thus the detection voltage is kept at 0 V and does not become greater than or equal to the voltage threshold Vth. For this reason, the control unit 50 detects a failure such as a short between both ends of the first downstream switch 20d or the second downstream switch 21d, the first downstream switch 20d or the second downstream switch 21d being half-on, or a ground fault. In this case, the control unit 50 instructs the switching unit 42 to switch the diagnostic switch 28 off while the instructions being output from the output units 40u, 40d, 41u, and 41d remain off instructions, and ends the motor drive processing.

When a failure such as a short between both ends of the second downstream switch 21d, the first downstream switch 20d or the second downstream switch 21d being half-on, or a ground fault has occurred while the value of the flag is 0, the control unit 50 performs the same processing as that performed when a short has occurred between both ends of the first downstream switch 20d while the value of the flag is 0.

As mentioned in the descriptions of the motor drive processing, when the forward rotation signal or the reverse rotation signal is input to the input unit 46 while the value of the flag is 1, the control unit 50 makes a diagnosis and detects a failure in the off instruction state, in which the first upstream drive circuit 24u, the first downstream drive circuit 24d, the second upstream drive circuit 25u, and the second downstream drive circuit 25d are outputting off instructions.

Open Detection Processing

Figure 9:
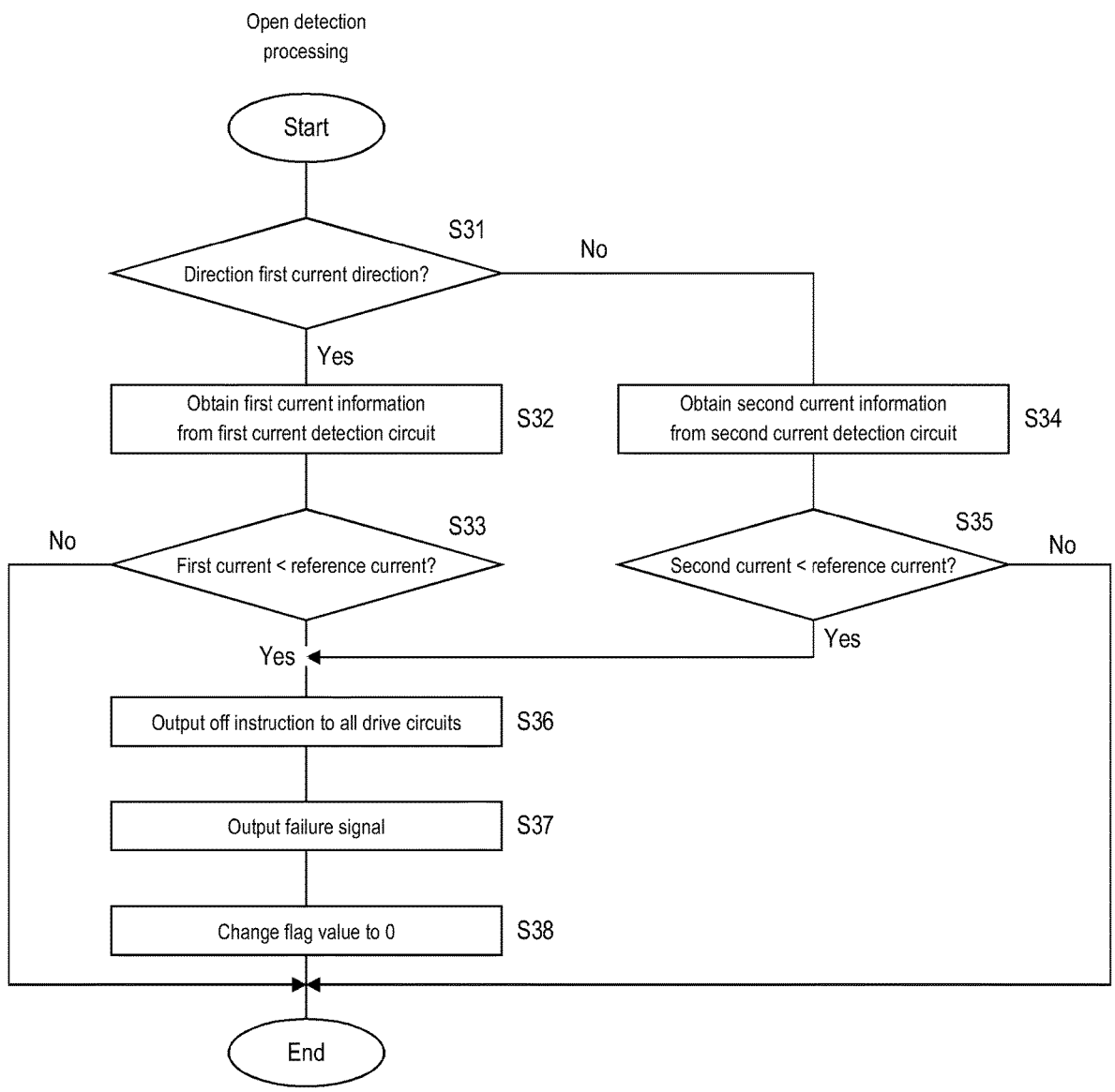
FIG. 9 is a flowchart illustrating an open diagnostic processing sequence.

FIG. 9 is a flowchart illustrating the open detection processing sequence. The control unit 50 executes the open detection processing periodically when the value of the flag is 1. When the drive device 10 is normal and the value of the flag is 1, current is flowing in the first current direction or the second current direction via the motor 12, and the motor 12 is rotating in the forward direction or the reverse direction.

In the open detection processing, first, under the assumption that the drive device 10 is normal, the control unit 50 determines whether or not the direction of the current flowing through the motor 12 is the first current direction (step S31). In step S31, if the output units 40u and 40d are outputting on instructions to the first upstream drive circuit 24u and the first downstream drive circuit 24d, respectively, and the output units 41u and 41d are outputting off instructions to the second upstream drive circuit 25u and the second downstream drive circuit 25d, the control unit 50 determines that the direction is the first current direction. If the output units 41u and 41d are outputting on instructions to the second upstream drive circuit 25u and the second downstream drive circuit 25d, and the output units 40u and 40d are outputting off instructions to the first upstream drive circuit 24u and the first downstream drive circuit 24d, respectively, the control unit 50 determines that the direction is not the first current direction.

If it is determined that the direction is the first current direction (S31: YES), the control unit 50 obtains the first current information from the first current detection circuit 26a (step S32). A reference current is stored in the storage unit 49 in advance. The reference current is a set value, and is greater than 0 A. Additionally, when the drive device 10 is normal, the reference current is less than or equal to the first current flowing through the motor 12 when the first upstream switch 20u and the first downstream switch 20d are on and the second upstream switch 21u and the second downstream switch 21d are off. Furthermore, when the drive device 10 is normal, the reference current is less than or equal to the second current flowing through the motor 12 when the second upstream switch 21u and the second downstream switch 21d are on and the first upstream switch 20u and the second downstream switch 21d are off.

Accordingly, when the drive device 10 is normal, the first current is greater than or equal to the reference current at the point in time when step S32 is executed. When the first upstream switch 20u or the first downstream switch 20d is open, no current flows via the shunt resistor 22a, and thus the first current detected by the first current detection circuit 26a is 0 A, which is less than the reference current. The first upstream switch 20u, the first downstream switch 20d, the second upstream switch 21u, and the second downstream switch 21d being "open" means a disconnection between the drain and the source.

The control unit 50 determines whether or not the first current indicated by the first current information obtained in step S32 is less than the reference current (step S33). The first current being less than the reference current means that a failure has occurred in the circuitry that drives the motor 12. By executing step S33, the control unit 50 detects the failure in the circuitry that drives the motor 12. The reference current functions as a predetermined current.

If it is determined that the direction is not the first current direction, i.e., that the direction is the second current direction (S31: NO), the control unit 50 obtains the second current information from the second current detection circuit 26b (step S34). When the drive device 10 is normal, the second current is greater than or equal to the reference current at the point in time when step S34 is executed. When the second upstream switch 21u and the second downstream switch 21d are open, no current flows via the shunt resistor 22b, and thus the second current detected by the second current detection circuit 26b is 0 A, which is less than the reference current.

The control unit 50 determines whether or not the second current indicated by the second current information obtained in step S34 is less than the reference current (step S35). The second current being less than the reference current means that a failure has occurred in the circuitry that drives the motor 12. By executing step S35, the control unit 50 detects the failure in the circuitry that drives the motor 12. Note that the reference current used in steps S33 and S35 may be values that are different from each other.

If it is determined that the first current is less than the reference current (S33: YES), or if it is determined that the second current is less than the reference current (S35: YES), the control unit 50 instructs the output units 40*u*, 40*d*, 41*u*, and 41*d* to output off instructions to all of the drive circuits, i.e., the first upstream drive circuit 24*u*, the first downstream drive circuit 24*d*, the second upstream drive circuit 25*u*, and the second downstream drive circuit 25*d*, under the assumption that a failure has been detected in the circuitry that drives the motor 12 (step S36). Next, the control unit 50 instructs the signal output unit 43 to output the failure signal (step S37), changes the value of the flag to 0 (step S38), and ends the open detection processing.

If it is determined that the first current is greater than or equal to the reference current (S33: NO), or if it is determined that the second current is greater than or equal to the reference current (S35: NO), the control unit 50 ends the open detection processing under the assumption that a failure has not been detected in the circuitry that drives the motor 12.

Effects, etc. of Drive Device 10

If the first upstream switch 20*u* and the second downstream switch 21*d* are mistakenly switched on, a large current flows via the first upstream switch 20*u*. At this time, the first current detected by the first current detection circuit 26*a* becomes greater than or equal to the first current threshold, and thus the first upstream drive circuit 24*u* immediately switches the first upstream switch 20*u* off and stops the flow of current via the first upstream switch 20*u*. For this reason, a large current does not flow via the first upstream switch 20*u* for a long time.

Likewise, if the second upstream switch 21*u* and the first downstream switch 20*d* are mistakenly switched on, a large current flows via the second upstream switch 21*u*. At this time, the second current detected by the second current detection circuit 26*b* becomes greater than or equal to the second current threshold, and thus the second upstream drive circuit 25*u* immediately switches the second upstream switch 21*u* off and stops the flow of current via the second upstream switch 21*u*. For this reason, a large current does not flow via the second upstream switch 21*u* for a long time.

Note that the diagnostic switch 28 may be disposed between the diagnostic resistors 29 and 30. In this case, the voltage detection circuit 31 detects a voltage at the connection node between the diagnostic switch 28 and the diagnostic resistor 30 with respect to the ground potential.

Second Embodiment

In the open detection processing according to the first embodiment, whether the first upstream switch 20*u*, the first downstream switch 20*d*, the second upstream switch 21*u*, and the second downstream switch 21*d* are open is detected on the basis of the first current detected by the first current detection circuit 26*a* or the second current detected by the second current detection circuit 26*b*. However, detecting the switches being open is not limited to detection based on the first current or the second current.

Points of the second embodiment that are different from the first embodiment will be described hereinafter. Configurations aside from those described hereinafter are the same as in the first embodiment. As such, constituent elements that are the same as in the first embodiment will be given the same reference signs as in the first embodiment, and descriptions thereof will be omitted.

Open Detection Processing

The drive device 10 according to the second embodiment differs from the drive device 10 according to the first embodiment in terms of the open detection processing.

Figure 10:
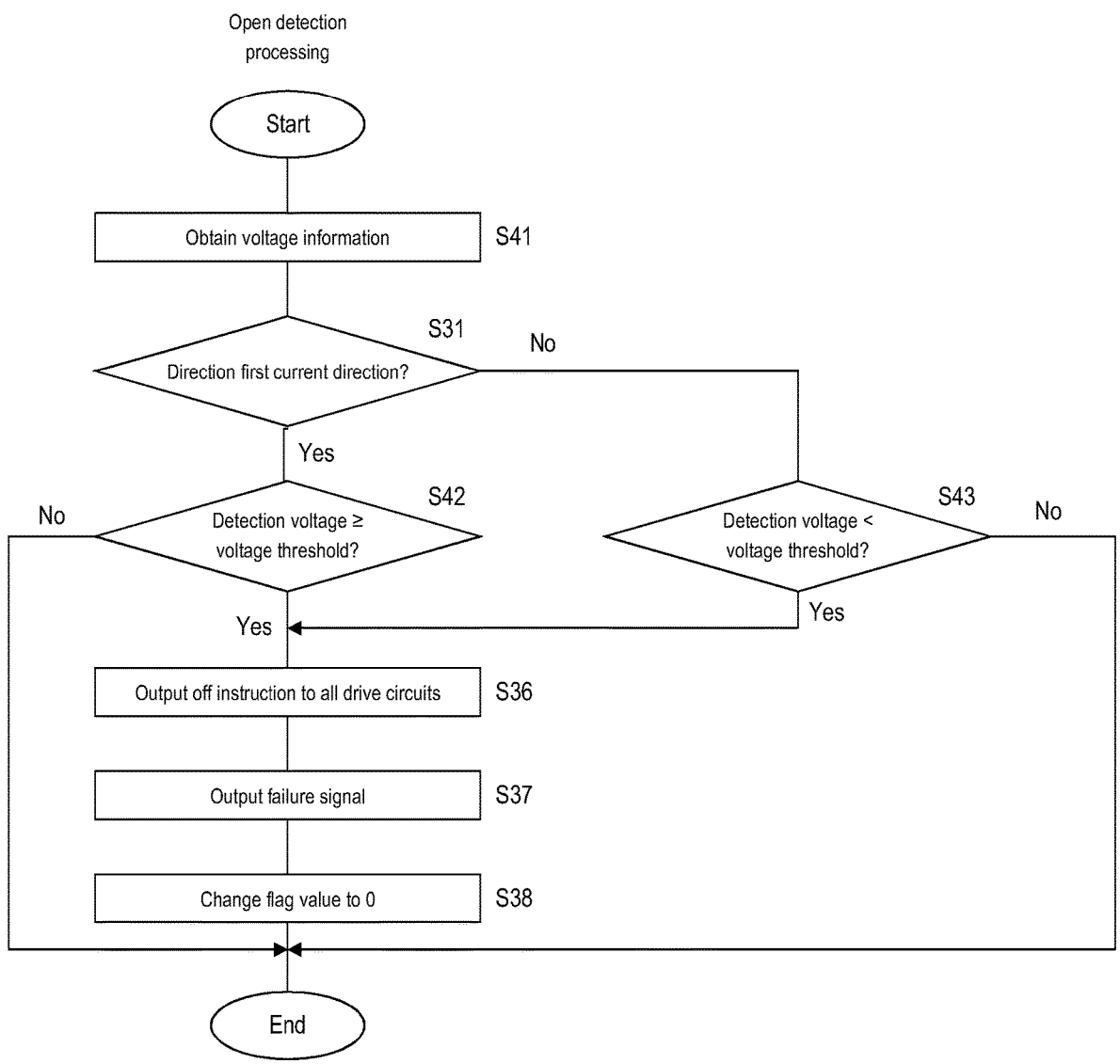
FIG. 10 is a flowchart illustrating an open diagnostic processing sequence according to a second embodiment.

FIG. 10 is a flowchart illustrating the open detection processing sequence according to the second embodiment. As in the first embodiment, the control unit 50 executes the open detection processing periodically when the value of the flag is 1. As mentioned in the descriptions of the first embodiment, the control unit 50 changes the value of the flag to 1 when the diagnostic switch 28 is off. While the value of the flag is 1, the control unit 50 does not instruct the switching unit 42 to switch the diagnostic switch 28 on, and instead keeps the diagnostic switch 28 off, aside from the period of the brief diagnosis executed when the forward rotation signal or the reverse rotation signal is input to the input unit 46. The open detection processing is executed with the diagnostic switch 28 being off.

Parts of the open detection processing according to the second embodiment are the same as parts of the open detection processing according to the first embodiment. Accordingly, parts of the open detection processing according to the second embodiment that are the same as in the open detection processing according to the first embodiment, i.e., steps S31 and S36 to S38, will not be described in detail.

In the open detection processing, first, the control unit 50 obtains the voltage information from the A/D conversion unit 45 (step S41). As mentioned in the descriptions of the first embodiment, the voltage information indicates the detection voltage detected by the voltage detection circuit 31. The control unit 50 executes step S31 after executing step S41. In step S31, as mentioned in the descriptions of the first embodiment, under the assumption that the drive device 10 is normal, the control unit 50 determines whether or not the direction of the current flowing through the motor 12 is the first current direction.

If it is determined that the direction is the first current direction, (S31: YES), the control unit 50 determines whether or not the detection voltage indicated by the voltage information obtained in step S41 is greater than or equal to the voltage threshold (step S42). When the drive device 10 is normal and the direction is the first current direction, the first downstream switch 20*d* is on, and thus the detection voltage detected by the voltage detection circuit 31 is 0 V, which is less than the voltage threshold. When the first downstream switch 20*d* is open, the first upstream switch 20*u* is on, and thus the detection voltage detected by the voltage detection circuit 31 is substantially the same as the battery voltage, which is greater than or equal to the voltage threshold. By executing step S42, the control unit 50 detects the failure in the circuitry that drives the motor 12.

If it is determined that the direction is not the first current direction, i.e., that the direction is the second current direction (S31: NO), the control unit 50 determines whether or not the detection voltage indicated by the voltage information obtained in step S41 is less than the voltage threshold (step S43). When the drive device 10 is normal and the direction is the second current direction, the second upstream switch 21*u* is on, and thus the detection voltage detected by the voltage detection circuit 31 is substantially the same as the battery voltage, which is greater than or equal to the voltage threshold. When the second upstream switch 21u is open, the second downstream switch 21d is on, and thus the detection voltage detected by the voltage detection circuit 31 is the same as 0 V, which is less than the voltage threshold. By executing step S43, the control unit 50 detects the failure in the circuitry that drives the motor 12.

If it is determined that the detection voltage is greater than or equal to the voltage threshold (S42: YES), or if it is determined that the detection voltage is less than the voltage threshold (S43: YES), the control unit 50 sequentially executes steps S36 to S38 under the assumption that a failure has been detected in the circuitry that drives the motor 12, and ends the open detection processing. If it is determined that the detection voltage is less than the voltage threshold (S42: NO), or if it is determined that the detection voltage is greater than or equal to the voltage threshold (S43: NO), the control unit 50 ends the open detection processing under the assumption that a failure has not been detected in the circuitry that drives the motor 12.

Operations of Drive Device 10

Figure 11:
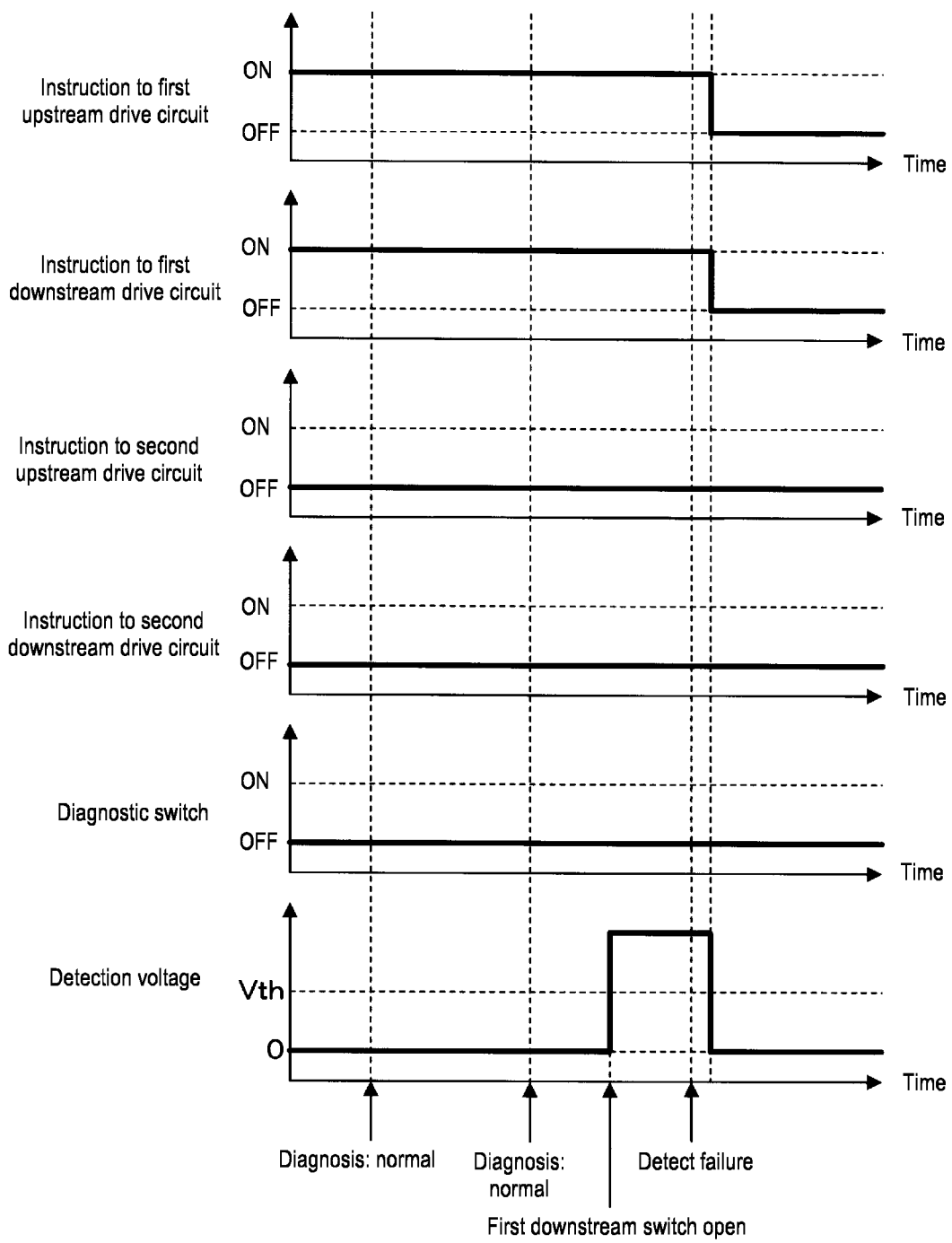
FIG. 11 is a timing chart illustrating operations of the drive device when the first downstream switch is open.

FIG. 11 is a timing chart illustrating operations of the drive device 10 when the first downstream switch is open. As in FIG. 6, FIG. 11 illustrates transitions of instructions for the first upstream drive circuit 24u, the first downstream drive circuit 24d, the second upstream drive circuit 25u, and the second downstream drive circuit 25d, transitions of the state of the diagnostic switch 28, and transitions of the detection voltage detected by the voltage detection circuit 31.

As described earlier, the control unit 50 executes the open detection processing periodically when the value of the flag is 1. The value of the flag being 1 means that the first upstream drive circuit 24u and the first downstream drive circuit 24d are outputting on instructions and the second upstream drive circuit 25u and the second downstream drive circuit 25d are outputting off instructions, or that the first upstream drive circuit 24u and the first downstream drive circuit 24d are outputting off instructions and the second upstream drive circuit 25u and the second downstream drive circuit 25d are outputting on instructions.

FIG. 11 illustrates a state in which the first upstream drive circuit 24u and the first downstream drive circuit 24d are outputting on instructions and the second upstream drive circuit 25u and the second downstream drive circuit 25d are outputting off instructions. When the drive device 10 is normal, current flows through the motor 12 in the first current direction, and the detection voltage is 0 V, which is less than the voltage threshold Vth. Accordingly, when the detection voltage is less than the voltage threshold Vth, in the open detection processing, the control unit 50 determines that the drive device 10 is normal.

When the first downstream switch 20d is opened, the first upstream switch 20u is on, and thus the detection voltage detected by the voltage detection circuit 31 is greater than or equal to the voltage threshold Vth. At this time, the detection voltage is substantially the same as the battery voltage. When the detection voltage is greater than or equal to the voltage threshold Vth, in the open detection processing, the control unit 50 detects a failure in the circuitry that drives the motor 12.

As described earlier, in the open detection processing, when a failure is detected in the circuitry that drives the motor 12, the control unit 50 instructs the output units 40u, 40d, 41u, and 41d to output off instructions to all the drive circuits. As a result, the first upstream drive circuit 24u and the first downstream drive circuit 24d switch the first upstream switch 20u and the first downstream switch 20d off, respectively. As a result, the detection voltage drops to 0 V.

Figure 12:
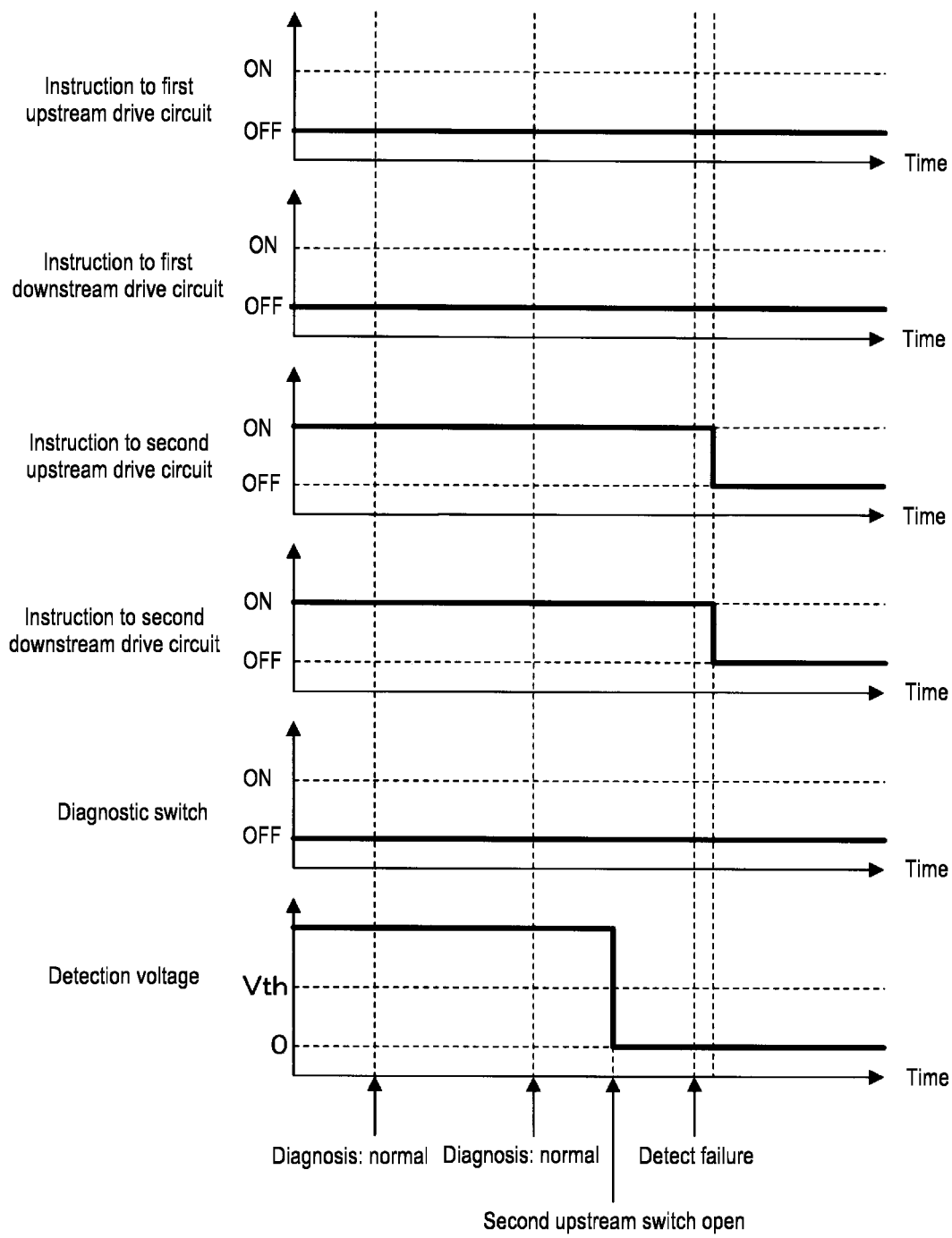
FIG. 12 is a timing chart illustrating operations of the drive device when the second upstream switch is open.

FIG. 12 is a timing chart illustrating operations of the drive device 10 when the second upstream switch 21u is opened. As in FIG. 6, FIG. 12 illustrates transitions of instructions for the first upstream drive circuit 24u, the first downstream drive circuit 24d, the second upstream drive circuit 25u, and the second downstream drive circuit 25d, transitions of the state of the diagnostic switch 28, and transitions of the detection voltage detected by the voltage detection circuit 31.

FIG. 12 illustrates a state where the first upstream drive circuit 24u and the first downstream drive circuit 24d are outputting off instructions and the second upstream drive circuit 25u and the second downstream drive circuit 25d are outputting on instructions. When the drive device 10 is normal, current flows through the motor 12 in the second current direction, and the detection voltage is substantially the same as the battery voltage, which is greater than or equal to the voltage threshold Vth. Accordingly, when the detection voltage is greater than or equal to the voltage threshold Vth, in the open detection processing, the control unit 50 determines that the drive device 10 is normal.

When the second upstream switch 21u is opened, the second downstream switch 21d is on, and thus the detection voltage detected by the voltage detection circuit 31 is less than the voltage threshold Vth. At this time, the detection voltage is the same as 0 V. When the detection voltage is less than the voltage threshold Vth, in the open detection processing, the control unit 50 detects a failure in the circuitry that drives the motor 12.

As described earlier, in the open detection processing, when a failure is detected in the circuitry that drives the motor 12, the control unit 50 instructs the output units 40u, 40d, 41u, and 41d to output off instructions to all the drive circuits. As a result, the first upstream drive circuit 24u and the first downstream drive circuit 24d switch the first upstream switch 20u and the first downstream switch 20d off, respectively.

As described above, in the drive device 10 according to the second embodiment, the control unit 50 detects a failure in the circuitry that drives the motor 12, and specifically the first downstream switch 20d and the second upstream switch 21u being open, on the basis of the detection voltage detected by the voltage detection circuit 31. Of the effects provided by the drive device 10 according to the first embodiment, the drive device 10 according to the second embodiment provides the same effects aside from the effect of detecting whether switches are open using the first current and the second current detected by the first current detection circuit 26a and the second current detection circuit 26b.

Note that the control unit 50 of the drive device 10 according to the first embodiment may execute both the open detection processing using the first current and the second current, and the open detection processing using the detection voltage.

Third Embodiment

In the open detection processing according to the first embodiment, whether the first upstream switch 20u, the first downstream switch 20d, the second upstream switch 21u, and the second downstream switch 21d are open is detected on the basis of the first current or the second current. In the open detection processing according to the second embodiment, whether the first downstream switch 20d and the second upstream switch 21u are open is detected on the basis of the detection voltage. Detecting whether the switches are open is not limited to detection based on the first current, the second current, or the detection voltage.

Points of a third embodiment that are different from the first embodiment will be described hereinafter. Configurations aside from those described hereinafter are the same as in the first embodiment. As such, constituent elements that are the same as in the first embodiment will be given the same reference signs as in the first embodiment, and descriptions thereof will be omitted.

Configuration of Power Supply System 1

Figure 13:
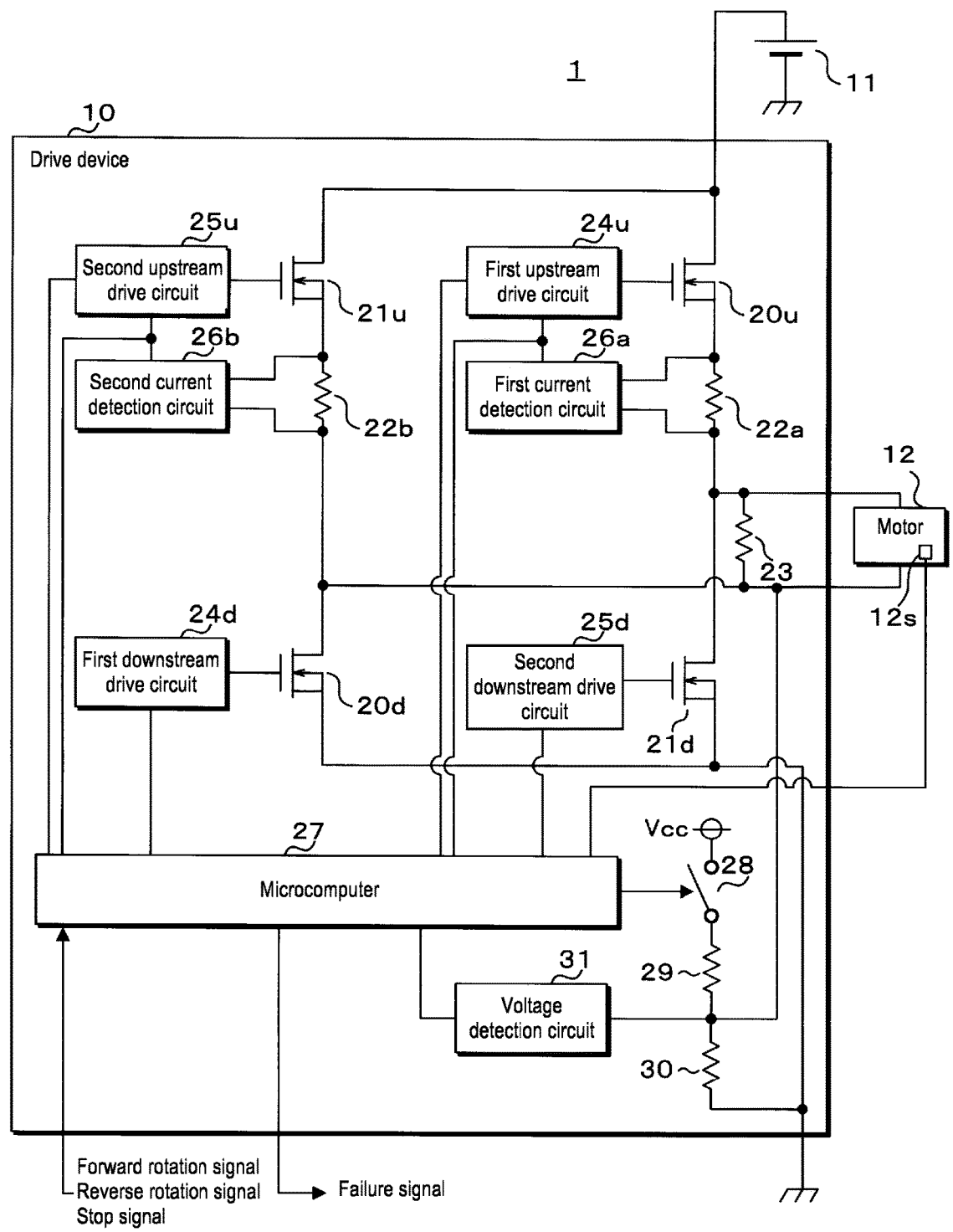
FIG. 13 is a block diagram illustrating the primary configuration of a power supply system according to a third embodiment.

FIG. 13 is a block diagram illustrating the primary configuration of the power supply system 1 according to the third embodiment. In the third embodiment, the motor 12 includes a Hall sensor 12s. The Hall sensor 12s is connected to the microcomputer 27.

As mentioned in the descriptions of the first embodiment, rotation of the motor 12 refers to rotation of a rotor. In the motor 12, a cylindrical rotor rotates about a shaft. The rotor is constituted by a permanent magnet, for example. In this case, N poles and S poles are arranged in an alternating manner along a circumferential direction of the rotor. The Hall sensor 12s is disposed facing the circumferential surface of the rotor. The Hall sensor 12s outputs a voltage corresponding to the strength of a magnetic field passing through the sensor as a sensor voltage. The sensor voltage output by the Hall sensor 12s is an analog value. Accordingly, the sensor voltage changes greatly when the magnetic pole of the rotor facing the Hall sensor 12s switches from an N pole to an S pole or from an S pole to an N pole. Regular change in the sensor voltage indicates that the motor 12 is rotating. The sensor voltage being stable indicates that the motor 12 is not rotating. The Hall sensor 12s outputs the sensor voltage to the microcomputer 27 as rotation information pertaining to the rotation of the motor 12.

Configuration of Microcomputer 27

Figure 14:
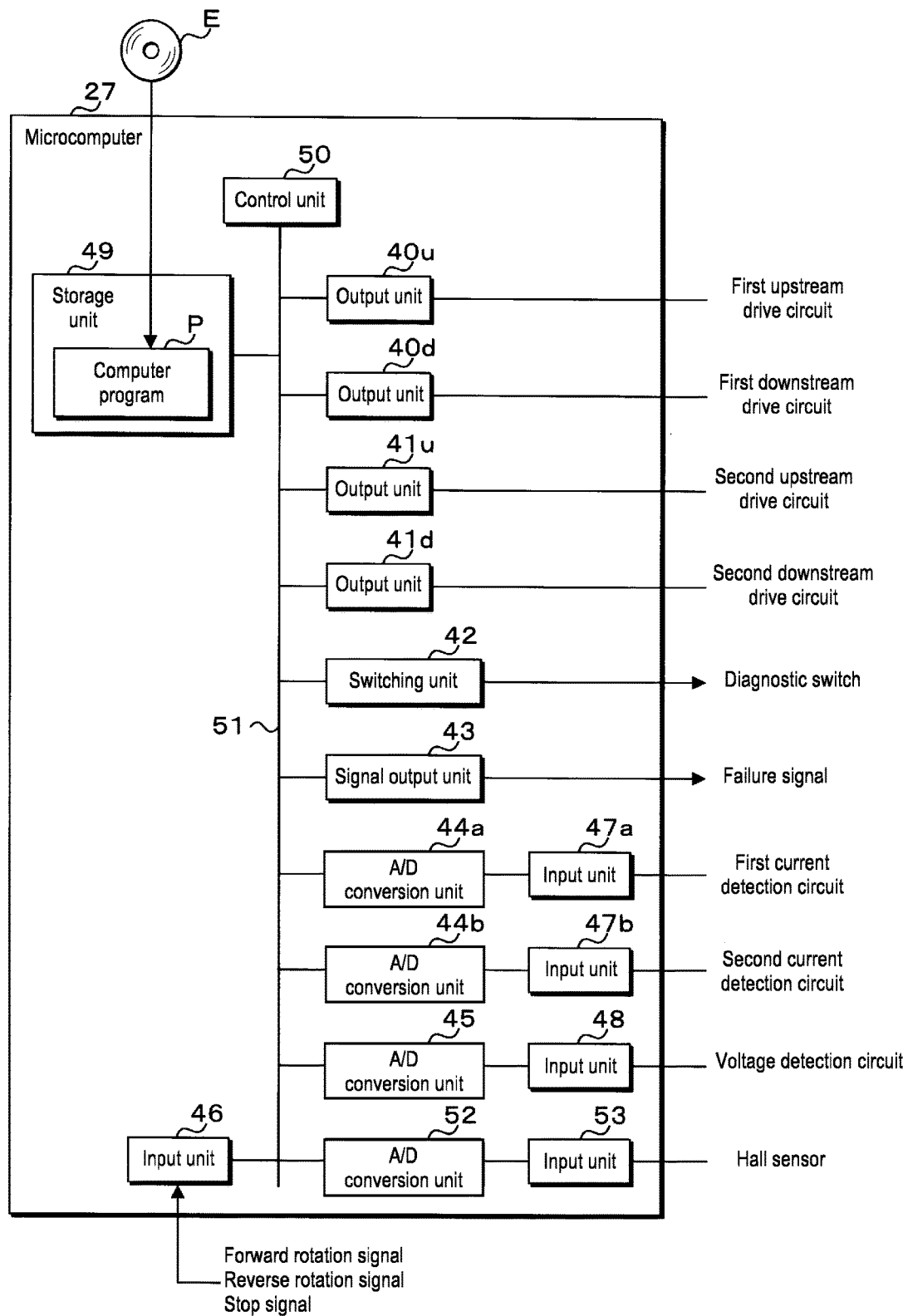
FIG. 14 is a block diagram illustrating the primary configuration of a microcomputer.

FIG. 14 is a block diagram illustrating the primary configuration of the microcomputer 27. The microcomputer 27 according to the third embodiment includes an A/D conversion unit 52 and an input unit 53 in addition to the constituent elements of the microcomputer 27 according to the first embodiment. The A/D conversion unit 52 is connected to the internal bus 51 and the input unit 53. The input unit 53 is connected to the Hall sensor 12s.

The Hall sensor 12s outputs the analog sensor voltage to the input unit 53. When the sensor voltage from the Hall sensor 12s is input, the input unit 53 outputs the input analog sensor voltage to the A/D conversion unit 52. The A/D conversion unit 52 converts the analog sensor voltage input from the input unit 53 into a digital sensor voltage. The control unit 50 obtains the digital sensor voltage from the A/D conversion unit 52. The sensor voltage obtained from the control unit 50 is substantially the same as the sensor voltage of the Hall sensor 12s at the point in time of the obtainment.

Open Detection Processing

Figure 15:
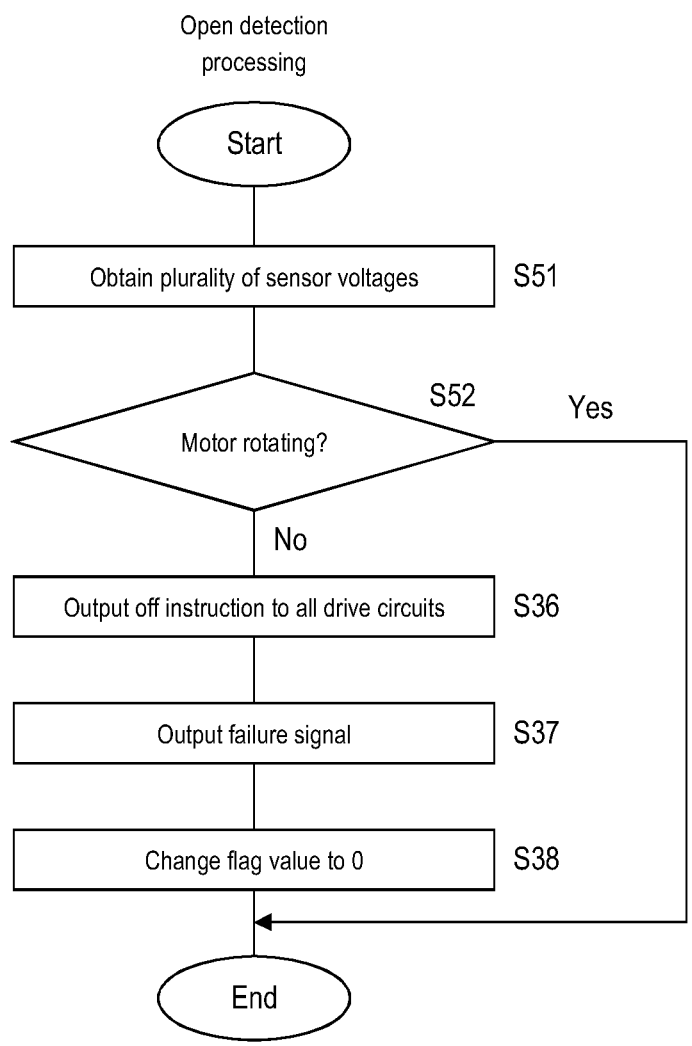
FIG. 15 is a flowchart illustrating an open diagnostic processing sequence.

FIG. 15 is a flowchart illustrating the open detection processing sequence. As in the first embodiment, the control unit 50 executes the open detection processing periodically when the value of the flag is 1. As mentioned in the descriptions of the first embodiment, when the value of the flag is 1, the output units 40u and 40d are outputting on instructions to the first upstream drive circuit 24u and the first downstream drive circuit 24d, or the output units 41u and 41d are outputting on instructions to the second upstream drive circuit 25u and the second downstream drive circuit 25d. Accordingly, when the drive device 10 is normal and the value of the flag is 1, the motor 12 is rotating in the forward direction or the reverse direction.

Parts of the open detection processing according to the third embodiment are the same as parts of the open detection processing according to the first embodiment. Accordingly, parts of the open detection processing according to the third embodiment that are the same as in the open detection processing according to the first embodiment, i.e., steps S36 to S38, will not be described in detail.

In the open detection processing, first, the control unit 50 obtains a plurality of sensor voltages from the A/D conversion unit 52 in time series (step S51). Next, on the basis of the plurality of sensor voltages obtained in step S51, the control unit 50 determines whether or not the motor 12 is rotating (step S52). In step S52, if the sensor voltage is changing regularly as described earlier, the control unit 50 determines that the motor 12 is rotating. If the sensor voltage is stable, the control unit 50 determines that the motor 12 is not rotating.

If the first upstream switch 20u or the first downstream switch 20d is open, the motor 12 will not rotate in the forward direction. If the second upstream switch 21u or the second downstream switch 21d is open, the motor 12 will not rotate in the reverse direction. By executing step S52, the control unit 50 detects a failure in the circuitry that drives the motor 12.

If it is determined that the motor 12 is not rotating (S52: NO), the control unit 50 sequentially executes steps S36 to S38 under the assumption that a failure in the circuitry that drives the motor 12 has been detected, and ends the open detection processing. If it is determined that the motor 12 is rotating (S52: YES), the control unit 50 ends the open detection processing under the assumption that a failure has not been detected in the circuitry that drives the motor 12.

As described above, in the drive device 10 according to the third embodiment, the control unit 50 detects a failure in the circuitry that drives the motor 12, and specifically the first upstream switch 20u, the first downstream switch 20d, the second upstream switch 21u, or the second downstream switch 21d being open, on the basis of the sensor voltage. Of the effects provided by the drive device 10 according to the first embodiment, the drive device 10 according to the third embodiment provides the same effects aside from the effect of detecting whether switches are open using the first current and the second current.

Note that the control unit 50 of the drive device 10 according to the first embodiment may execute one or both of the open detection processing using the detection voltage and the open detection processing using the sensor voltage in addition to the open detection processing using the first current and the second current. The control unit 50 of the drive device 10 according to the second embodiment may execute the open detection processing using the sensor voltage in addition to the open detection processing using the detection voltage.

Fourth Embodiment

In the first embodiment, the first upstream switch 20u and the second upstream switch 21u are semiconductor switches. However, the first upstream switch 20u and the second upstream switch 21u are not limited to semiconductor switches.

Points of a fourth embodiment that are different from the first embodiment will be described hereinafter. Configurations aside from those described hereinafter are the same as in the first embodiment. As such, constituent elements that are the same as in the first embodiment will be given the same reference signs as in the first embodiment, and descriptions thereof will be omitted.

Configuration of Drive Device 10

Figure 16:
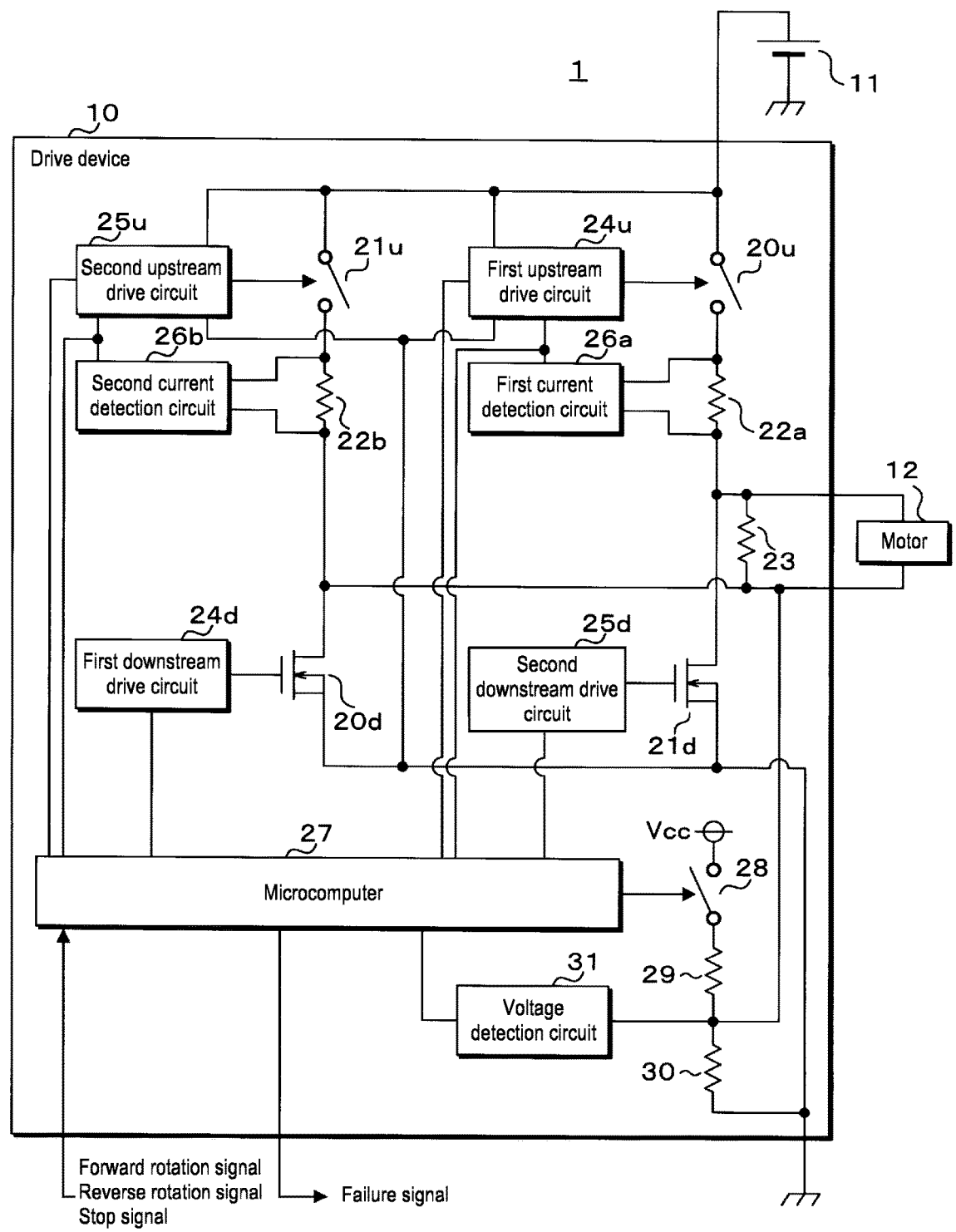
FIG. 16 is a block diagram illustrating the primary configuration of a power supply system according to a fourth embodiment.

FIG. 16 is a block diagram illustrating the primary configuration of the power supply system 1 according to the fourth embodiment. The power supply system 1 according to the fourth embodiment differs from the power supply system 1 according to the first embodiment in terms of the configuration of the drive device 10. In the fourth embodiment, the first upstream switch 20u and the second upstream switch 21u of the drive device 10 are relay contacts. Each of the first upstream switch 20u and the second upstream switch 21u includes an input terminal, an output terminal, and a rod-shaped conductor having an end rotatably connected to the input terminal. The conductor is subjected to a force in a direction away from the output terminal using a spring, for example. When the conductors are separated from the corresponding output terminals, the first upstream switch 20u and the second upstream switch 21u are off. When the conductors are in contact with the corresponding output terminals, the first upstream switch 20u and the second upstream switch 21u are on.

The input terminals of the first upstream switch 20u and the second upstream switch 21u are connected to the positive terminal of the battery 11. The output terminals of the first upstream switch 20u and the second upstream switch 21u are connected to one end of the shunt resistors 22a and 22b, respectively. The first upstream drive circuit 24u and the second upstream drive circuit 25u are connected to the input terminals of the first upstream switch 20u and the second upstream switch 21u, respectively, and are also grounded. As in the first embodiment, the first upstream drive circuit 24u and the second upstream drive circuit 25u switch the first upstream switch 20u and the second upstream switch 21u on or off, respectively.

Configuration of First Upstream Drive Circuit 24u

Figure 17:
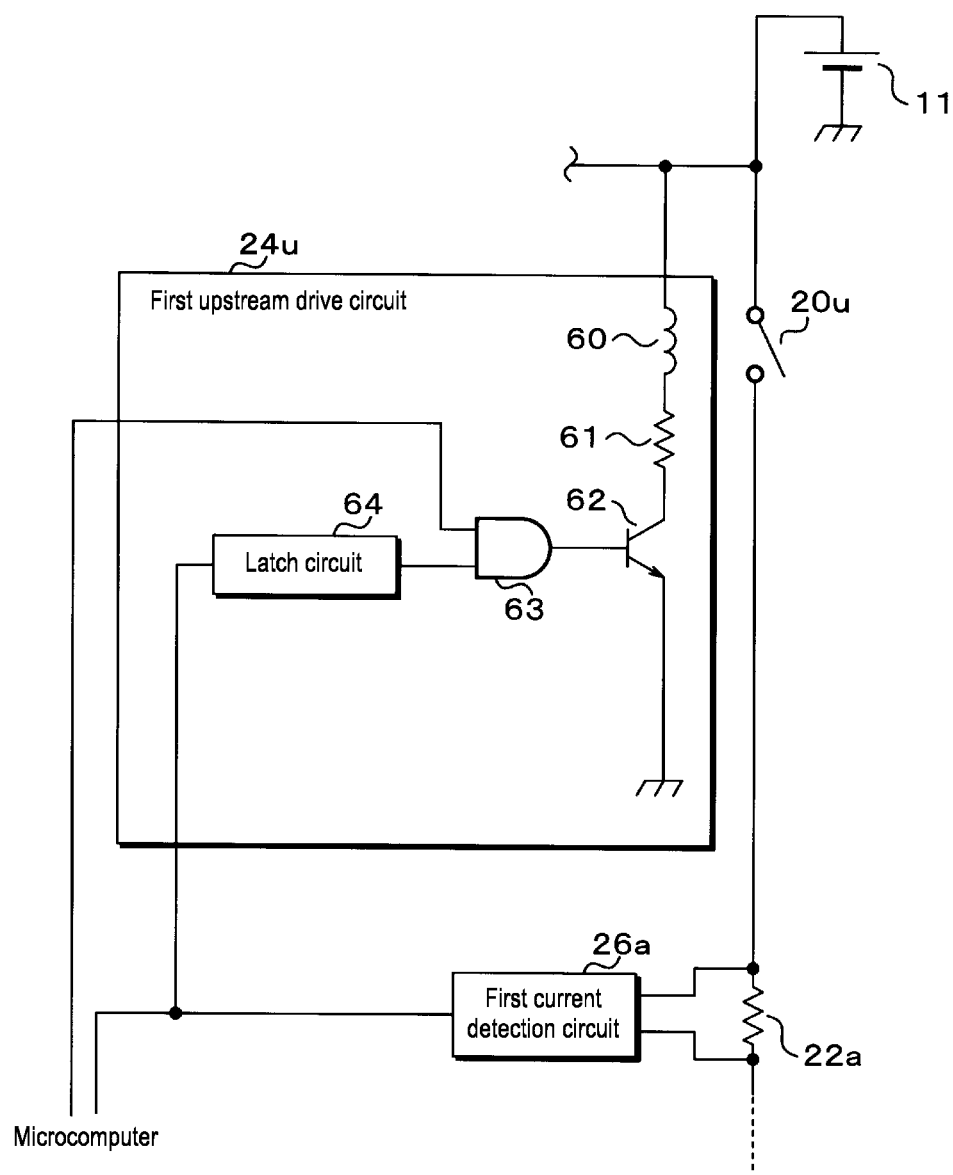
FIG. 17 is a circuit diagram of a first upstream drive circuit.

FIG. 17 is a circuit diagram of the first upstream drive circuit 24u. The first upstream drive circuit 24u includes an inductor 60, a current limiting resistor 61, a drive switch 62, an AND circuit 63, and a latch circuit 64. The drive switch 62 is an NPN bipolar transistor. One end of the inductor 60 is connected to the input terminal of the first upstream switch 20u. The other end of the inductor 60 is connected to one end of the current limiting resistor 61. The other end of the current limiting resistor 61 is connected to the collector of the drive switch 62. The emitter of the drive switch 62 is grounded. The base of the drive switch 62 is connected to an output end of the AND circuit 63. One input end of the AND circuit 63 is connected to an output end of the latch circuit 64. An input end of the latch circuit 64 is connected to the first current detection circuit 26a.

The AND circuit 63 outputs a high level voltage or a low level voltage to the base of the drive switch 62. When the AND circuit 63 is outputting the high level voltage, the drive switch 62 is on, and current can flow via the collector and the emitter of the drive switch 62. When the AND circuit 63 is outputting the low level voltage, the drive switch 62 is off.

When the drive switch 62 switches on, current flows from the positive terminal of the battery 11 to the inductor 60, the current limiting resistor 61, and the drive switch 62 in that order. As a result, the inductor 60 functions as a magnet, pulling the conductor of the first upstream switch 20u and causing the conductor to make contact with the output terminal of the first upstream switch 20u. As a result, the first upstream switch 20u switches on. When the drive switch 62 switches off, the flow of current via the inductor 60 stops, and the inductor 60 therefore stops functioning as a magnet. As a result, in the first upstream switch 20u, the conductor separates from the output terminal and the first upstream switch 20u switches off.

The output unit 40u outputs the high level voltage as an on instruction and the low level voltage as an off instruction. The first current information from the first current detection circuit 26a is input to the latch circuit 64. The latch circuit 64 continues to output the high level voltage while the first current indicated by the first current information input from the first current detection circuit 26a is less than the first current threshold. When the first current indicated by the first current information input from the first current detection circuit 26a becomes greater than or equal to the first current threshold, the latch circuit 64 switches the output to the AND circuit 63 from the high level voltage to the low level voltage. The latch circuit 64 then continues to output the low level voltage regardless of the first current information input from the first current detection circuit 26a.

The AND circuit 63 outputs the voltage, input from the output unit 40u, to the base of the drive switch 62 from the output end while the latch circuit 64 continues to output the high level voltage. For this reason, when the output unit 40u is outputting an on instruction, the drive switch 62 is on and the first upstream switch 20u is on. When the output unit 40u is outputting an off instruction, the drive switch 62 is off and the first upstream switch 20u is off.

When the voltage being output by the latch circuit 64 switches from the high level voltage to the low level voltage, the AND circuit 63 switches the voltage being output to the drive switch 62 to the low level voltage regardless of the voltage being output by the output unit 40u. As a result, the drive switch 62 switches off and the first upstream switch 20u switches off. The first upstream switch 20u is kept off while the latch circuit 64 is outputting the low level voltage.

The second upstream drive circuit 25u is configured in the same way as the first upstream drive circuit 24u. In the descriptions of the first upstream drive circuit 24u, the first upstream switch 20u, the first current detection circuit 26a, the output unit 40u, and the first current threshold correspond to the second upstream switch 21u, the second current detection circuit 26b, the output unit 41u, and the second current threshold, respectively. The output unit 41u outputs the high level voltage as an on instruction and the low level voltage as an off instruction.

The drive device 10 according to the fourth embodiment provides the same effects as those provided by the drive device 10 according to the first embodiment.

Note that in the first to third embodiments, the first upstream switch 20u, the first upstream drive circuit 24u, the second upstream switch 21u, and the second upstream drive circuit 25u may be configured in the same way as in the fourth embodiment.

Fifth Embodiment

In the first embodiment, the diagnostic switch 28 is disposed upstream from at least one of the diagnostic resistors 29 and 30. However, the location of the diagnostic switch 28 is not limited to being upstream from at least one of the diagnostic resistors 29 and 30.

Points of a fifth embodiment that are different from the first embodiment will be described hereinafter. Configurations aside from those described hereinafter are the same as in the first embodiment. As such, constituent elements that are the same as in the first embodiment will be given the same reference signs as in the first embodiment, and descriptions thereof will be omitted.

Configuration of Drive Device 10

Figure 18:
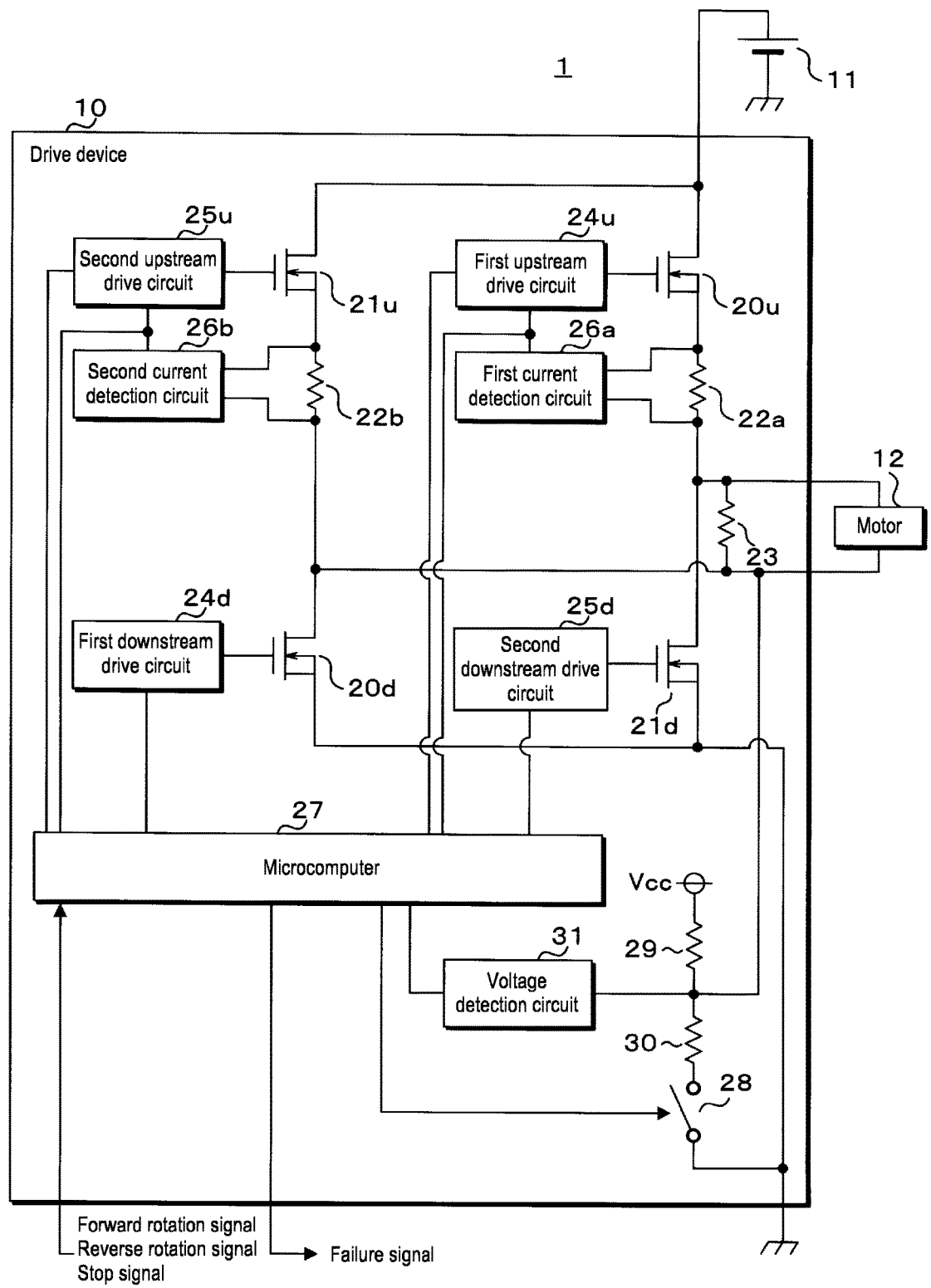
FIG. 18 is a block diagram illustrating the primary configuration of a power supply system according to a fifth embodiment.

FIG. 18 is a block diagram illustrating the primary configuration of the power supply system 1 according to the fifth embodiment. The power supply system 1 according to the fifth embodiment differs from the power supply system 1 according to the first embodiment in terms of the configuration of the drive device 10. In the drive device 10 according to the fifth embodiment, the constant voltage Vcc is applied to one end of the diagnostic resistor 29. The other end of the diagnostic resistor 30 is connected to one end of the diagnostic switch 28. The other end of the diagnostic switch 28 is grounded.

Assume that the first upstream switch 20u, the first downstream switch 20d, the second upstream switch 21u, and the second downstream switch 21d are off. When the drive device 10 is normal and the diagnostic switch 28 is off, the voltage detection circuit 31 detects the constant voltage Vcc. When a failure has occurred, such as both ends of the first downstream switch 20d or the second downstream switch 21d being shorted, the first downstream switch 20d or the second downstream switch 21d being half-on, or a ground fault, and the diagnostic switch 28 is off, the voltage detection circuit 31 detects a value close to 0 V.

When the drive device 10 is normal and the diagnostic switch 28 is on, the voltage detection circuit 31 detects the voltage obtained by the diagnostic resistors 29 and 30 dividing the constant voltage Vcc. When a failure has occurred, such as both ends of the first upstream switch 20u or the second upstream switch 21u being shorted, the first upstream switch 20u or the second upstream switch 21u being half-on, or a line-to-line fault, and the diagnostic switch 28 is on, the voltage detected by the voltage detection circuit 31 is substantially the same as the battery voltage.

In the fifth embodiment, the voltage threshold is set to a voltage that is higher than the voltage obtained by the diagnostic resistors 29 and 30 dividing the constant voltage Vcc and less than or equal to the constant voltage Vcc.

The constant voltage Vcc is greater than or equal to the voltage threshold, and the value close to 0 V is less than the voltage threshold. For this reason, when the diagnostic switch 28 is off, the control unit 50 can detect a failure such as a short between both ends of the first downstream switch 20d or the second downstream switch 21d, the first downstream switch 20d or the second downstream switch 21d being half-on, or a ground fault.

The voltage obtained by the diagnostic resistors 29 and 30 dividing the constant voltage Vcc is less than the voltage threshold, and the battery voltage is greater than or equal to the voltage threshold. For this reason, when the diagnostic switch 28 is on, the control unit 50 can detect a failure such as both ends of the first upstream switch 20u or the second upstream switch 21u being shorted, the first upstream switch 20u or the second upstream switch 21u being half-on, or a line-to-line fault.

Motor Drive Processing

Figure 19:
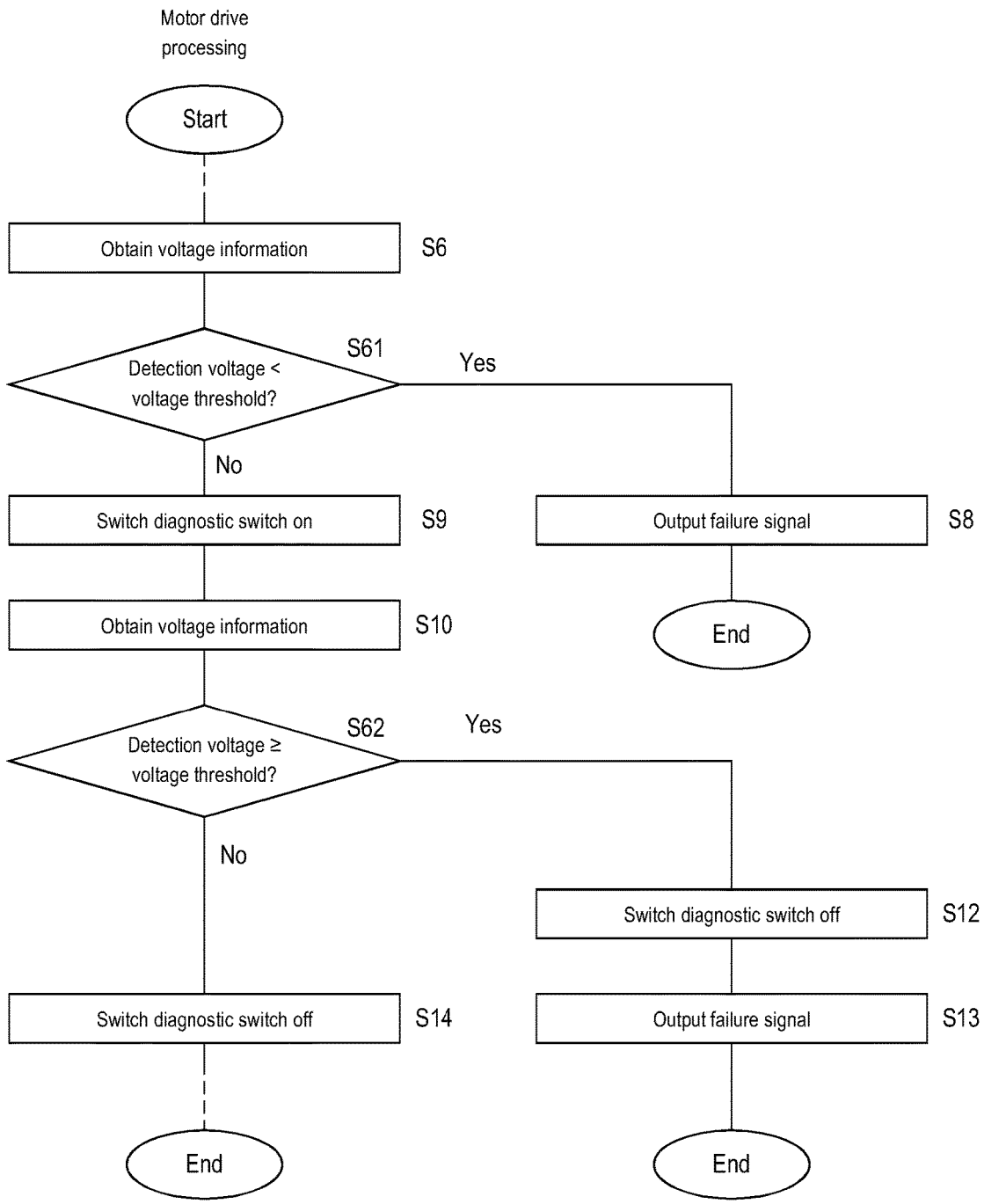
FIG. 19 is a flowchart illustrating a motor drive processing sequence.

FIG. 19 is a flowchart illustrating the motor drive processing sequence. As in the first embodiment, when the forward rotation signal or the reverse rotation signal is input to the input unit 46, the control unit 50 executes the motor drive processing.

Parts of the motor drive processing according to the fifth embodiment are the same as parts of the motor drive processing according to the first embodiment. Accordingly, parts of the motor drive processing according to the fifth embodiment that are the same as in the motor drive processing according to the first embodiment, i.e., steps S1 to S6, S8 to S10, and S12 to S18, will not be described in detail.

After executing step S6, the control unit 50 determines whether or not the detection voltage indicated by the voltage information obtained in step S6 is less than the voltage threshold (step S61). The detection voltage being less than the voltage threshold means that a failure has occurred, such as both ends of the first downstream switch 20d or the second downstream switch 21d being shorted, the first downstream switch 20d or the second downstream switch 21d being half-on, or a ground fault. By executing step S61, the control unit 50 detects a failure in the circuitry that drives the motor 12. If it is determined that the detection voltage is less than the voltage threshold (S61: YES), the control unit 50 executes step S8 under the assumption that a failure has been detected. If it is determined that the detection voltage is greater than or equal to the voltage threshold (S61: NO), the control unit 50 executes step S9.

After executing step S10, the control unit 50 determines whether or not the detection voltage indicated by the voltage information obtained in step S10 is greater than or equal to the voltage threshold (step S62). The detection voltage being greater than or equal to the voltage threshold means that a failure has occurred, such as both ends of the first upstream switch 20u or the second upstream switch 21u being shorted, the first upstream switch 20u or the first upstream switch 20u being half-on, or a line-to-line fault. By executing step S62, the control unit 50 detects a failure in the circuitry that drives the motor 12. If it is determined that the detection voltage is greater than or equal to the voltage threshold (S62: YES), the control unit 50 executes step S12 under the assumption that a failure has been detected. If it is determined that the detection voltage is less than the voltage threshold (S62: NO), the control unit 50 executes step S14.

The drive device 10 according to the fifth embodiment provides the same effects as those provided by the drive device 10 according to the first embodiment.

Note that in the fifth embodiment, the diagnostic switch 28 may be connected between the diagnostic resistors 29 and 30. In this case, the voltage detection circuit 31 detects a voltage at the connection node between the diagnostic switch 28 and the diagnostic resistor 29 with respect to the ground potential.

Additionally, in the fifth embodiment, the first upstream switch 20u, the first upstream drive circuit 24u, the second upstream switch 21u, and the second upstream drive circuit 25u may be configured in the same way as in the fourth embodiment. Additionally, the control unit 50 of the drive device 10 according to the fifth embodiment may execute the open detection processing of the third embodiment using the sensor voltage in addition to the open detection processing using the first current and the second current. Furthermore, the control unit 50 of the drive device 10 according to the fifth embodiment may execute the open detection processing of the third embodiment using the sensor voltage instead of the open detection processing using the first current and the second current.

Sixth Embodiment

In the first embodiment, the first current detection circuit 26a and the second current detection circuit 26b detect current using the shunt resistors 22a and 22b, respectively. However, the configurations of the first current detection circuit 26a and the second current detection circuit 26b are not limited to configurations using the shunt resistor 22a or the shunt resistor 22b.

Points of the sixth embodiment that are different from the first embodiment will be described hereinafter. Configurations aside from those described hereinafter are the same as in the first embodiment. As such, constituent elements that are the same as in the first embodiment will be given the same reference signs as in the first embodiment, and descriptions thereof will be omitted.

Figure 20:
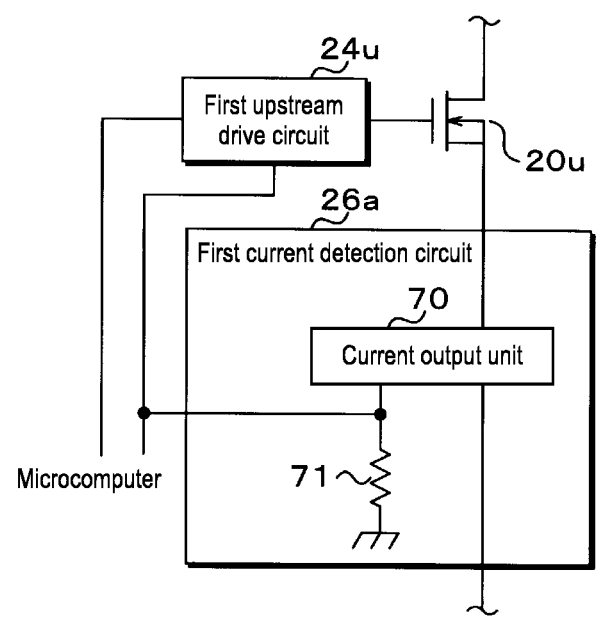
FIG. 20 is a block diagram illustrating the primary configuration of a first current detection circuit according to a sixth embodiment.

FIG. 20 is a block diagram illustrating the primary configuration of the first current detection circuit 26a according to the sixth embodiment. In the sixth embodiment, the first current detection circuit 26a includes a current output unit 70 and a circuit resistor 71. The current output unit 70 is connected to the source of the first upstream switch 20u and one end of the motor 12 and the load resistor 23. The current output unit 70 is furthermore connected to one end of the circuit resistor 71. The other end of the circuit resistor 71 is grounded. The connection node between the current output unit 70 and the circuit resistor 71 is connected to the first upstream drive circuit 24u and the microcomputer 27.

When the first upstream drive circuit 24u and the first downstream drive circuit 24d switch the first upstream switch 20u and the first downstream switch 20d on, the first current flows via the first upstream switch 20u. The first current flows through the first upstream switch 20u and the current output unit 70 in that order, and is output to the motor 12 from the current output unit 70. At this time, the current flows in the first current direction in the motor 12. As a result, power is supplied to the motor 12, and the motor 12 rotates in the forward direction. The path of the current flowing from the positive terminal of the battery 11 to the first upstream switch 20u, the current output unit 70, the motor 12, and the first downstream switch 20d in that order corresponds to the first current path.

The current output unit 70 includes, for example, a current mirror circuit, and outputs, to the circuit resistor 71, current that is a predetermined fraction, e.g., $1/1000$, of the first current output to the motor 12. The resistance value of the circuit resistor 71 is constant. The voltage between both ends of the circuit resistor 71 is proportional to the first current. The first current is calculated by dividing the product of a predetermined number and the voltage between both ends the circuit resistor 71 by the resistance value of the circuit resistor 71. The voltage between both ends of the circuit resistor 71 is output to the first upstream drive circuit 24u and the microcomputer 27 as the first current information indicating the first current detected by the first current detection circuit 26a.

In the sixth embodiment, the second current detection circuit 26b is configured in the same way as the first current detection circuit 26a. In this case, in the second current detection circuit 26b, the current output unit 70 is connected to the source of the second upstream switch 21u and the other end of the motor 12 and the load resistor 23. The connection node between the current output unit 70 and the circuit resistor 71 is connected to the second upstream drive circuit 25u and the microcomputer 27.

When the second upstream drive circuit 25u and the second downstream drive circuit 25d switch the second upstream switch 21u and the second downstream switch 21d on, the second current flows via the second upstream switch 21u. The second current flows through the second upstream switch 21u and the current output unit 70 in that order, and is output to the motor 12 from the current output unit 70. At this time, the current flows in the second current direction in the motor 12. As a result, power is supplied to the motor 12, and the motor 12 rotates in the reverse direction. The path of the current flowing from the positive terminal of the battery 11 to the second upstream switch 21u, the current output unit 70, the motor 12, and the second downstream switch 21d in that order corresponds to the second current path.

In the second current detection circuit 26b, the voltage between both ends of the circuit resistor 71 is proportional to the second current. The voltage between both ends of the circuit resistor 71 is output to the second upstream drive circuit 25u and the microcomputer 27 as the second current information indicating the second current detected by the second current detection circuit 26b.

The drive device 10 according to the sixth embodiment configured as described above provides the same effects as those of the drive device 10 according to the first embodiment.

Note that in the second to fifth embodiments, the first current detection circuit 26a and the second current detection circuit 26b may be configured including the current output unit 70 and the circuit resistor 71, respectively, in the same manner as in the sixth embodiment.

Note that in the first to third, fifth, and sixth embodiments, the first upstream switch 20u and the second upstream switch 21u each need only function as a switch, and are therefore not limited to N-channel FETs or relay contacts, and may instead be P-channel FETs, Insulated Gate Bipolar Transistors (IGBTs), or the like. Furthermore, in the first to sixth embodiments, the first downstream switch 20d and the second downstream switch 21d each need only function as a switch, and are therefore not limited to N-channel FETs, and may instead be relay contacts, IGBTs, P-channel FETs, or the like. However, it is preferable that switches used for PWM control be a semiconductor switches.

Additionally, in the first to fifth embodiments, the configuration in which the first current detection circuit 26a and the second current detection circuit 26b each detects current is not limited to a configuration using the shunt resistors 22a and 22b, or a configuration including the current output unit 70 and the circuit resistor 71, and may be, for example, a configuration using a current sensor.

Furthermore, in the first to sixth embodiments, the first downstream drive circuit 24d may, like the first upstream drive circuit 24u, have a function for switching off the first downstream switch 20d when the current flowing therethrough has become greater than or equal to the first current threshold. Likewise, the second downstream drive circuit 25d may, like the second upstream drive circuit 25u, have a function for switching off the second downstream switch 21d when the current flowing therethrough has become greater than or equal to the second current threshold.

Additionally, in the first to sixth embodiments, the load resistor 23 may be omitted from the drive device 10 when the resistance value between both ends of the motor 12 is sufficiently lower than the resistance value of the diagnostic resistor 30. Furthermore, in the first to sixth embodiments, the load driven by the drive device 10 is not limited to the motor 12, and may be any electric device in which the direction of DC voltage application is switched.

The first to sixth embodiments disclosed here are intended to be in all ways exemplary and in no ways limiting. The scope of the present disclosure is defined not by the foregoing descriptions but by the scope of the claims, and is intended to include all changes equivalent in meaning to and falling within the scope of the claims.

The invention claimed is:

1. A drive device that drives a load, the drive device comprising:
    a first upstream switch disposed upstream from the load in a first current path of current flowing via the load;
    a first downstream switch disposed downstream from the load in the first current path;
    a second upstream switch disposed upstream from the load in a second current path of current flowing via the load;
    a second downstream switch disposed downstream from the load in the second current path;
    a current detection circuit that detects current flowing via the first upstream switch;
    a stop circuit that stops flow of the current via the first upstream switch when the current detected by the current detection circuit becomes greater than or equal to a current threshold, wherein a direction of the current flowing in the load when current is flowing in the first current path is different from a direction of the current flowing in the load when current is flowing in the second current path;
    a series circuit in which a first resistor, a second resistor, and a circuit switch are connected in series, a connection node between the first resistor and the second resistor is connected to a connection node between the load, the first downstream switch, and the second upstream switch, and to which a constant voltage is applied;
    a voltage detection circuit that detects a voltage at the connection node between the first resistor and the second resistor; and
    a processing unit that executes processing, wherein the processing unit executes processing of:
    switching the circuit switch on or off; and
    detecting a failure in circuitry that drives the load on the basis of the voltage detected by the voltage detection circuit in an off instruction state in which turning off of the first upstream switch, the first downstream switch, the second upstream switch, and the second downstream switch is instructed.

2. The drive device according to claim 1, comprising:
    a second current detection circuit that detects current flowing via the second upstream switch; and
    a second stop circuit that stops flow of the current via the second upstream switch when the current detected by the second current detection circuit becomes greater than or equal to a second current threshold.

3. The drive device according to claim 2, wherein the stop circuit and the second stop circuit switch the first upstream switch and the second upstream switch off, respectively.

4. The drive device according to claim 1, wherein the circuit switch is disposed upstream from the first resistor or the second resistor,
    the connection node to which the voltage detection circuit is connected is located downstream from the circuit switch, and
    the processing unit executes processing of:
    switching the circuit switch off; and
    detecting a failure in the circuitry that drives the load when the voltage detected by the voltage detection circuit in the off instruction state is greater than or equal to a predetermined voltage, and
    the predetermined voltage is higher than 0 V.

5. The drive device according to claim 4, wherein the processing unit executes processing of:
    switching the circuit switch on; and
    detecting a failure in the circuitry that drives the load when the voltage detected by the voltage detection circuit in the off instruction state is less than the second predetermined voltage, and
    the second predetermined voltage is less than or equal to a voltage obtained by the first resistor and the second resistor dividing the constant voltage.

6. The drive device according to claim 4, wherein the processing unit executes processing of:
    detecting a failure in the circuitry that drives the load on the basis of the voltage detected by the voltage detection circuit when the circuit switch is off while switching on of the first upstream switch and the first downstream switch is instructed and switching off of the second upstream switch and the second downstream switch is instructed off or when switching on of the circuit switch is off while the second upstream switch and the second downstream switch is instructed and switching off of the first upstream switch and the first downstream switch is instructed.

7. The drive device according to claim 1, wherein the processing unit executes processing of:
    switching the circuit switch on; and
    detecting a failure in the circuitry that drives the load when the voltage detected by the voltage detection circuit in the off instruction state is less than the second predetermined voltage, and
    the second predetermined voltage is less than or equal to a voltage obtained by the first resistor and the second resistor dividing the constant voltage.

8. The drive device according to claim 7, wherein the processing unit executes processing of:
    detecting a failure in the circuitry that drives the load on the basis of the voltage detected by the voltage detection circuit when the circuit switch is off while switching on of the first upstream switch and the first downstream switch is instructed and switching off of the second upstream switch and the second downstream switch is instructed off or when switching on of the circuit switch is off while the second upstream switch and the second downstream switch is instructed and switching off of the first upstream switch and the first downstream switch is instructed.

9. The drive device according to claim 1, wherein the processing unit executes processing of:
    detecting a failure in the circuitry that drives the load on the basis of the voltage detected by the voltage detection circuit when the circuit switch is off while switching on of the first upstream switch and the first downstream switch is instructed and switching off of the second upstream switch and the second downstream switch is instructed off or when switching on of the circuit switch is off while the second upstream switch and the second downstream switch is instructed and switching off of the first upstream switch and the first downstream switch is instructed.

10. The drive device according to claim 1, comprising:
    a processing unit that executes processing,
    wherein the processing unit executes processing of:
    detecting a failure in circuitry that drives the load when the current detected by the current detection circuit is less than the predetermined current while switching on of the first upstream switch and the first downstream switch is instructed.

11. The drive device according to claim 1, comprising:
a processing unit that executes processing,
wherein the load is a motor, and
the processing unit executes processing of:
obtaining rotation information pertaining to rotation of the motor in a state where switching on of the first upstream switch and the first downstream switch is instructed or switching off of the second upstream switch and the second downstream switch is instructed;
determining whether or not the load is rotating on the basis of the rotation information obtained; and
detecting a failure in circuitry that drives the load when the load is determined not to be rotating.

* * * * *